(12) United States Patent
Stark et al.

(10) Patent No.: US 6,342,800 B1
(45) Date of Patent: Jan. 29, 2002

(54) CHARGE COMPENSATION CONTROL CIRCUIT AND METHOD FOR USE WITH OUTPUT DRIVER

(75) Inventors: Donald C. Stark, Palo Alot; Jun Kim, Redwood City; Kurt T. Knorpp, San Carlos; Michael Tak-Kei Ching, Sunnyvale, all of CA (US); Natsuki Kushiyama, Yokohama (JP)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/698,997

(22) Filed: Oct. 26, 2000

Related U.S. Application Data

(63) Continuation of application No. 09/222,590, filed on Dec. 28, 1998, now Pat. No. 6,163,178.

(51) Int. Cl.[7] ............................................... H03K 5/12
(52) U.S. Cl. ...................................... 327/170; 327/175
(58) Field of Search ................................. 327/108, 134, 327/170, 172, 173, 174, 175, 176; 326/30, 39, 82, 86

(56) References Cited

U.S. PATENT DOCUMENTS

| 5,194,765 A | 3/1993 | Dunlop et al. ................. 326/27 |
| 5,197,765 A | 3/1993 | Dunlop et al. ................. 326/87 |
| 5,254,883 A | 10/1993 | Horowitz et al. .............. 326/30 |
| 5,430,400 A | 7/1995 | Herlein ....................... 327/108 |
| 5,530,377 A | 6/1996 | Walls .......................... 326/30 |
| 5,847,578 A | * 12/1998 | Noakes et al. ................. 326/39 |
| 5,949,254 A | 9/1999 | Keeth .......................... 326/87 |
| 6,049,726 A | * 3/2000 | Martin ........................ 327/175 |

FOREIGN PATENT DOCUMENTS

| EP | 0 463 316 A1 | 1/1992 | ........... H04L/12/40 |
| EP | 0 482 392 A2 | 4/1992 | ........... H04L/25/08 |
| JP | 58-54412 | 3/1983 | |

OTHER PUBLICATIONS

Allen, Arnold O.; "Probability, Statistics, and Queueing Theory with Computer Sicence Applications"; $2^{nd}$Edition, CH 7; pp. 450, 458–459.

Chappell, Terry I. et al.; "A 2nd Cycle, 4ns Access 512 kb CMOS ECL Sram"; IEEE International Solid State Circuits Conference 1991; pp. 50–51.

Donnelly, Kevin S. et al.; "A 660 MB§Interface Megacell Portable Circuit in 0.3 $\mu$m–0.7 $\mu$m CMOS ASIC"; IEEE Journal of Solid State Cirucuits; vol. 31, No. 12, December 1996, pp. 1995–2003.

Pilo, Harold et al.; "A 300 MHz 3.3V 1 Mb SRAM Fabricated in a 0.5 $\mu$m CMOS Process"; IEEE International Solid State Circuits Conference 1996; pp. 148–149.

Schumacher, Hans–Jürgen et al.; "CMOS Subnanosecond True–ECL Output Buffer"; IEEE Journal of Solid–State Cirucuits; vol. 25, No. 1, February 1990 pp. 150–154.

Sidiropoulos, Stefanos et al.; "A 700–Mb/s/pin CMOS Signaling Interface Using Current Integrating Receivers"; IEEE Journal of Solid–State Circuits; vol. 32, No. 5, May 1997; pp. 681–690.

Yang, Tsen–Shau et al.; "A 4–ns 4Kx1–bit Two–Port BiCMOS SRAM"; IEEE Journal of D–State Circuits; vol. 23, No. 5, October 1998; pp. 1030–1040.

* cited by examiner

Primary Examiner—Kenneth B. Wells
Assistant Examiner—Paul Dinh
(74) Attorney, Agent, or Firm—Pennie & Edmonds LLP

(57) ABSTRACT

An output driver has an output multiplexor and an output current driver. The output multiplexor receives a data signal and outputs a q-node signal. The output current driver receives the q-node signal and drives a bus based on the q-node signal. The output multiplexor processes the data signal in various ways to generate the q-node signal. The output current driver is responsive to current control bits to select a amount of output drive current. In addition, the output multiplexor is controlled such that the output impedance of the output current driver is maintained within a predetermined range.

11 Claims, 22 Drawing Sheets

CHARGE COMPENSATION CONTROL CIRCUIT AND METHOD FOR USE WITH OUTPUT DRIVER

This application is a continuation of U.S. patent application Ser. No. 09/222,590, filed Dec. 28, 1998, now U.S. Pat. No. 6,163,178.

BACKGROUND OF THE INVENTION

The present invention relates generally to an output driver for integrated circuits, and more specifically to an apparatus and method for a bus output driver for integrated circuits.

Integrated circuits connect to and communicate with each other. Typically, integrated circuits communicate with each other using a bus with address, data and control signals.

In FIG. 1, a bus 20 interconnects a memory controller 22 and memory modules (RAMS) 24, 26, 28. Physically, the bus comprises the traces on a printed circuit board, wires or cables and connectors. Each of these integrated circuits has a bus output driver circuit 30 that interfaces with the bus 20 to drive data signals onto the bus to send data to other ones of the integrated circuits. In particular, the bus output drivers 30 in the memory controller 22 and RAMS 24, 26, 28 are used to transmit data over the bus 20. The bus 20 operates or transmits signals at a speed that is a function of many factors such as the system clock speed, the bus length, the amount of current that the output drivers can drive, the supply voltages, the spacing and width of the wires or traces making up the bus, the physical layout of the bus itself and the resistance of a pull up resistor attached to each bus.

The address, data and control lines making up the bus will be referred to as channels. In some systems, all channels connect to a pull-up resistor $Z_0$. Typically the resistance of the pull up resistor is 28 ohms.

Output drivers for use on a bus, such as is shown in FIG. 1, are preferably current mode drivers, which are designed to drive the bus 20 with a determinable amount of current substantially independent of the voltage on the driver output. The output impedance of the driver 30 is a good metric of how much the driver's current will change with voltage changes on the driver's output, a high output impedance being desirable for the current mode driver. In addition, a high output impedance is desirable to minimize transmission line reflections on the bus when a particular driver 30 receives voltage changes from another driver on the bus 20. In such a case, a driver with a high output impedance will not substantially alter the impedance of the bus 20, thus causing only a small portion of a wave to be reflected at the location where the driver 30 is attached to the bus.

FIG. 2A shows a prior art bus output driver circuit 30 which has an output multiplexor 32 that connects to an output current driver 34 at q-node 40. The q-node 40 refers to the physical connection between the output multiplexor 32 and the output current driver 34. A q-node signal is output to the q-node 40. The q-node signal is a voltage level that causes the output current driver 34 to drive a corresponding voltage level on the bus 20 (also herein called a bus channel).

The output multiplexor 32 receives a clock signal at a clock input 42, and receives odd and even data signals at the odd data and even data inputs 44 and 46, respectively. The odd and even data signals are synchronized to the clock signal. The output multiplexor 32 transmits the data from the odd data and even data inputs onto the q-node 40 on the rising and falling edges of the clock signal, respectively.

The slew rate and output current of the bus output driver 30 are controllable. A set of slew rate control bits 50 is used to select the slew rate of the transitions of the q-node signal. A slew rate estimator 48 may be used to generate the slew rate control bits 50. Alternately, the slew rate control bits 50 may be generated by a process detector, a register that is programmed with a fixed value during manufacture or during testing of the device after manufacture, or by any other type of slew rate detection circuitry. The source of the slew rate control bits 50 may be external to the bus output driver 30. The output current driver 34 outputs a signal, called Vout, that corresponds to the q-node signal, onto the bus channel 20. A current control block 52 outputs a set of current control bits 54 that select the amount of current used to drive data onto the bus channel 20. The current control block 52 may be external to the bus output driver 30, and may be implemented as a current level detector or as a register programmed with a fixed value during or after manufacture of the device.

FIG. 2B is a schematic of the prior art output multiplexor and output current driver of FIG. 2A. The clock, odd data and even data signals are input to multiple current control blocks 62, 64 and each current control block 62, 64 outputs a q-node signal on a q-node 66, 68, 70, 72. In FIG. 2B, the q-nodes 66, 68, 70, 72 are also designated as q<6>–q<0>, respectively. When the q-node signal has a sufficiently high voltage level, a corresponding transistor $T_0$–$T_6$ in the output current driver becomes active and pulls Vout low. Each q-node signal drives a binary weighted pulldown device $T_0$–$T_6$ in the output current driver. In other words, multiple q-nodes 66, 68, 70, 72 are used to drive a single channel 20 of the bus. The transistors $T_0$–$T_6$ are n-type metal-oxide-semiconductor (MOS) transistors and are binary weighted with respect to each other. In particular, each transistor $T_0$–$T_6$ will drive or sink a predetermined amount of current with respect to $I_{out}$. Transistor $T_0$ sinks $2^0$ or $1 \times I_{out}$ (e.g., about 0.26 milliamps minimum), transistor $T_4$ sinks $2^4$ or $16 \times I_{out}$, transistor $T_5$ sinks $32 \times I_{out}$, and transistor $T_6$ sinks $64 \times I_{out}$.

Since the current control blocks 62, 64 are similar, one current control block 62 will be described. The current control block 62 has an input block 82 and a pre-driver 84. The input block 82 is responsive to a current control signal output on a current control bit line 84. In FIG. 2B, the current control signals are shown as Current Control <0> through Current Control <6>. Each q-node 66, 68, 70, 72 is associated with a separate current control signal. The current control signal enables the NAND gates 86, 88 to respond to the odd and even data signals. Each NAND gate 86, 88 outputs, its signal to a pair of passgates 92, 94, respectively. The passgate pairs 92, 24 are responsive to the clock signal such that one passgate pair 92, 94 is on at a time, outputting either the odd data or even data signal. The output of the passgates 92, 94 is connected to the pre-driver 84.

If the current control signal on the current control bit line 84 is at a low voltage, the NAND gates 86, 88 output a high voltage level regardless of the voltage level of the odd or even data signal, thereby causing a "low" voltage level at the associated q-node and disabling the corresponding transistor in the output current driver.

If the current control signal on the current control bit line 84 is at a high voltage level, the NAND gates 86, 88 are enabled, and the predriver 84, q-node and output current driver are responsive to the odd and even data signals.

In the prior art output driver 30, the output impedance of the output driver 30 is not well controlled, and is determined by the value of a supply voltage, Vcc (the high voltage for the q-node), the output voltage when it is being driven low, and the characteristics of the transistors in the output current driver 34.

FIG. 2C is a schematic of the prior art pre-driver 84 of FIG. 2B. The predriver has many predriver sub-blocks 96, 98, 100. Each predriver sub-block 96, 98, 100 has an inverter I1, I2, I3 and a passgate pair 102, 104, 106 respectively. One predriver sub-block 96 is always enabled with the gate of each transistor of the passgate pair 102 connected to the power supply Vcc and to ground, respectively. The other passgate pairs 104, 106 of the predriver sub-blocks 98, 100 connect to the slew rate control bits, Slew Rate Control <0> and Slew Rate Control <1>. The slew rate of the predriver 84 is adjusted by enabling and disabling the passgates 104, 106 with slew rate control signals on the slew rate control bits.

In particular, when the slew rate control signal on Slew Rate Control bit <1> is high, the passgate pair 104 of the predriver subblock 98 is enabled. The passgate pair 104 increases the rate of transition between a high voltage level and a low voltage level of the q-node signal on the q-node 66. When the slew rate control bit <1> is low, the corresponding passgate pair 104 of the predriver sub-block 98 is effectively disabled and the slew rate is unaffected. Enabling the additional passgate pairs of additional predriver subblocks 100 further increases the slew rate of the q-node signal.

However, when using multiple q-nodes to drive a single channel, it is difficult to match the delays and slew rates of each q-node under all process, voltage and temperature conditions.

Therefore, there is a need for an output driver whose output impedance is maintained within a desired range. There is also a need for an impedance controlled output driver which ha s an adjustable slow rate and operating current.

SUMMARY OF THE INVENTION

An output driver has an output multiplexor and an output current driver. The output multiplexor receives a data signal and outputs a q-node signal to the output current driver. In the output current driver, an output drive transistor receives the q-node signal. The output drive transistor has a predetermined threshold voltage and an output impedance which is maintained within a predetermined range when the output drive transistor is outputting a low voltage level.

In this way, the q-node signal is used to control the slew rate and output impedance of the signal output by the output driver.

In another embodiment, the output current driver is responsive to a current control signal which is used to select a desired amount of drive current onto the bus. The output current driver has transistor stacks that are responsive to the current control signal to enable the q-node signal to cause a predetermined amount of current to flow through the transistor stack.

From another viewpoint, the present invention is directed to a method and apparatus that satisfies the need to have an output driver with an adjustable operating current and adjustable slew rate.

In a preferred embodiment, the output driver includes an output current driver operating as a current mode driver. The output current driver is driven from a predriver which receives its power from a carefully regulated power supply. The regulated supply causes the high voltage level of the control signal to be substantially equal to the regulated supply voltage in order to maintain the output impedance of the output current driver above a predetermined threshold when the output driver is outputting a low voltage level.

Additionally, the output current driver includes circuitry to permit the operating current of the output current driver to be adjustable and the predriver includes circuitry to permit the slew rate of the control signal to be adjustable. To help meet the goals of an adjustable slew rate and adjustable operating current, a single control node (q-node) is employed between the predriver and the output current driver. Not only does the single control node simplify implementation of the adjustable operating current and adjustable slew rate features, it further simplifies the design of the impedance controlled driver. Thus, the output driver has a controlled and determinable output impedance. Additionally, an impedance controlled driver has an adjustable slew rate and adjustable operating current. The result is a driver having controlled switching characteristics, a more stable output current on a bus, and a driver which minimizes reflections from other drivers on the bus. The regulated power supply for the predriver includes a v-gate supply for generating the regulated supply voltage. A charge compensator is coupled to the predriver to help maintain the v-gate supply voltage when the predriver is changing state. The v-gate supply includes a v-gate generator for generating the regulated supply voltage and a charge compensation bit generator for controlling the charge compensator. Furthermore, to maintain the duty cycle of the output signal from the output driver when slew rate adjustments are made, a duty cycle compensator is employed to pre-compensate the signal received by the predriver. Also, to aid the predriver in driving the control signal to ground, a kickdown circuit is employed and coupled in parallel with the predriver.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 3:
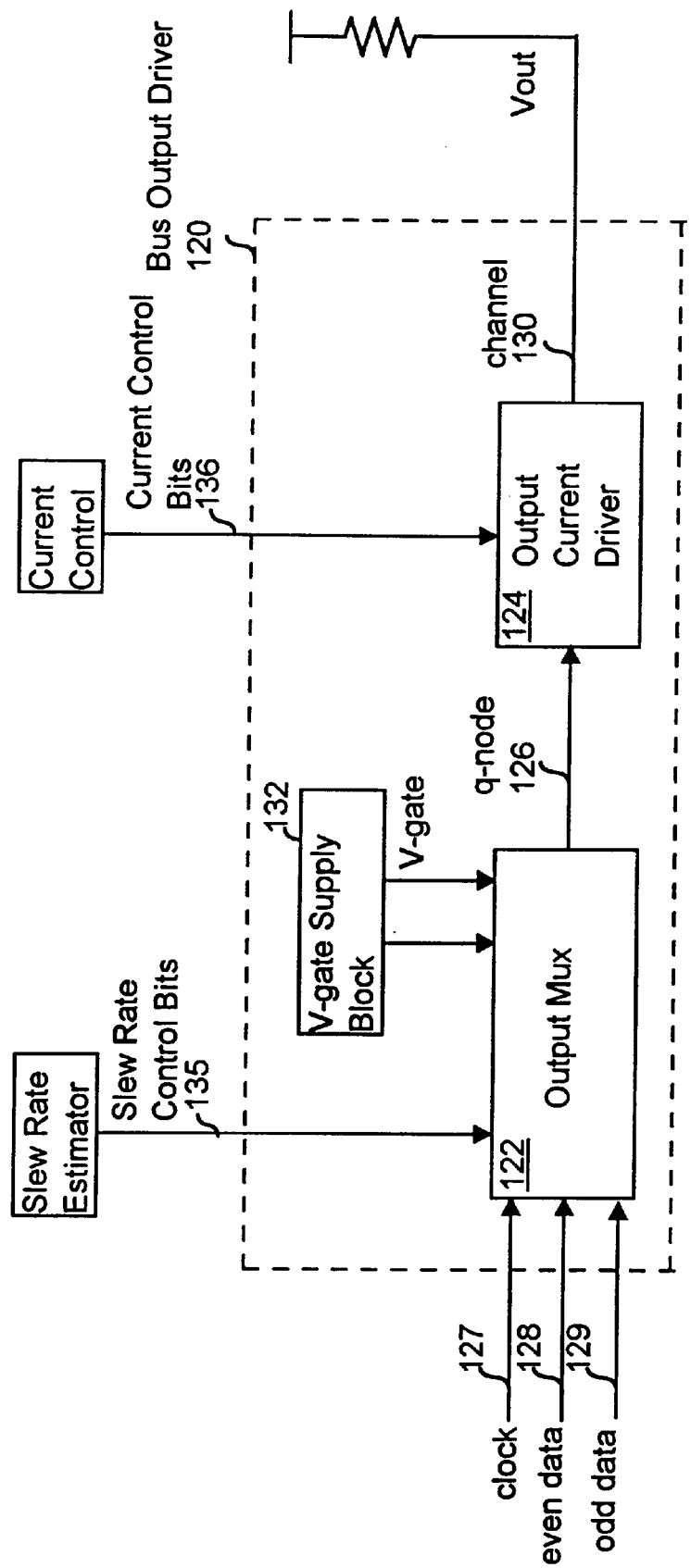
FIG. 3 is a block diagram of a bus output driver of the present invention.

In FIG. 3, a bus output driver 120 has an output multiplexor 122 that connects to an output current driver 124 at a q-node 126. A clock signal, an even data signal, and an odd data signal are supplied to the output multiplexor 122 at a clock input 127, an even data input 128 and an odd data input 129, respectively. The output multiplexor 122 outputs a q-node signal on the q-node 126 that is used to control the slew rate and output impedance of a channel signal, Vout. In response to the q-node signal, the output current driver 124 outputs the channel signal, Vout, on the channel 130 of the bus. A V-gate supply block 132 supplies control signals and a V-gate voltage to the output multiplexor 122 and will be discussed in detail below. In another embodiment, the V-gate supply block 132 is not used.

The output multiplexor 122 is responsive to a slew rate control signal, consisting of slew rate control (SRC) bits 135, received from a slew rate estimator, which may be external to the bus output driver 120. The slew rate estimator is not part of the present invention, but is part of the context in which the invention operates.

The output current driver 124 is responsive to current control bits 136 from a current control block, which may be external to the bus output driver 120. The current control block is not part of the present invention, but is part of the context in which the invention operates.

Figure 4:
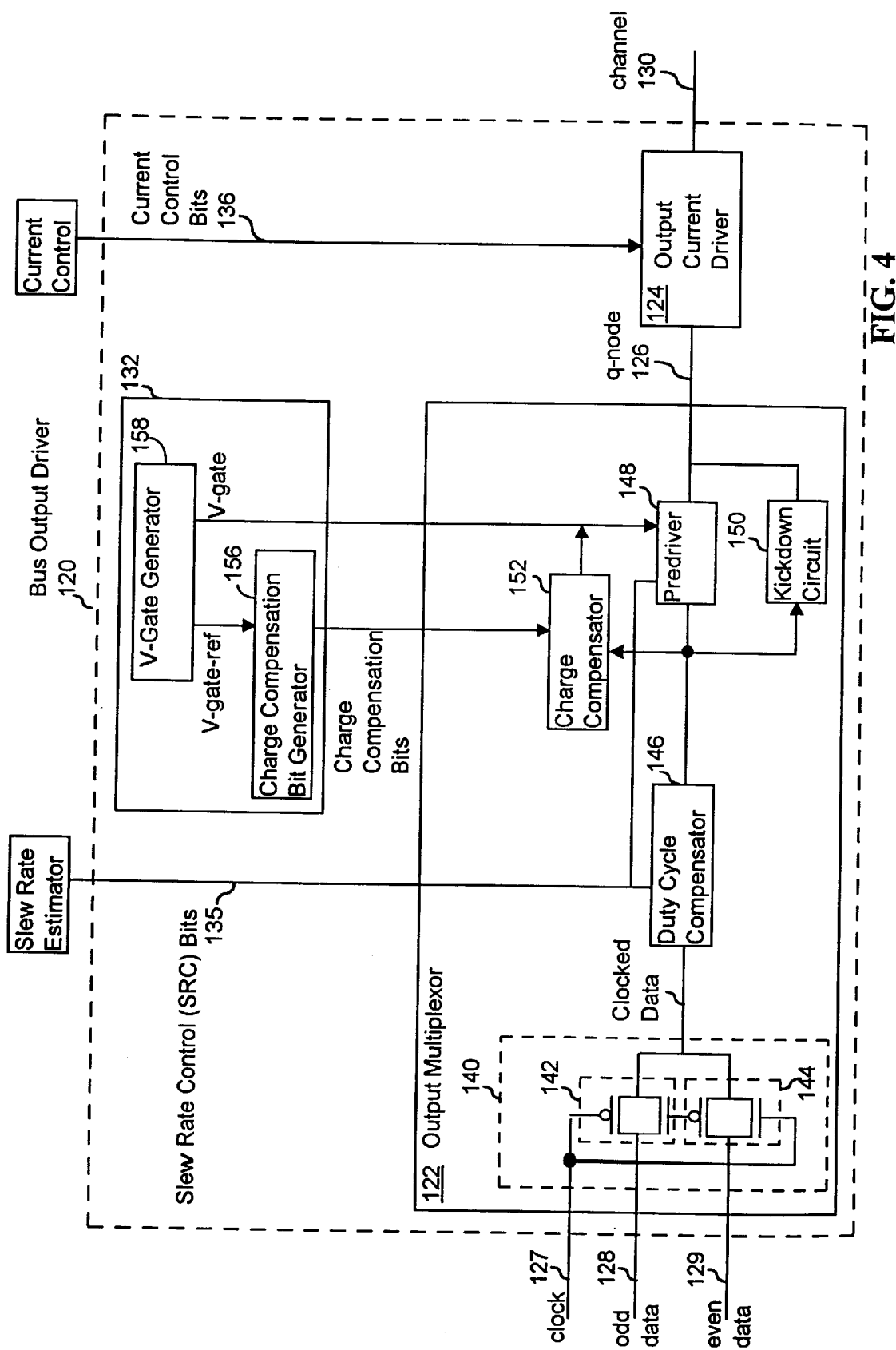
FIG. 4 is a detailed block diagram of the bus output driver of FIG. 3.

FIG. 4 shows the overall architecture of the bus output driver 120 of the present invention. In particular, the output multiplexor 122 has the following components:

An input block 140, with dual pass-gate pairs 142, 144, receives and multiplexes the data signals using the clock signal. The passgate pairs multiplex the odd and even data signals using the clock signal to output a clocked data signal.

A duty cycle compensator 146 generates a precompensated clocked data signal by modifying the duty cycle of the clocked data signal by a predetermined amount.

A predriver 148 generates a q-node signal by selectively modifying the slew rate of the precompensated clocked data signal. The q-node signal transitions between a low voltage level and a high voltage level and has a duty cycle which results in a 50% duty cycle at Vout. The predriver is responsive to slew rate control signals on the slew rate control bits 135.

A kickdown circuit 150 increases the rate of transition of the q-node signal from a high voltage level to a low voltage level for a portion of the transition.

A charge compensator 152 maintains a V-gate voltage and hence the high voltage level of the q-node signal within a predetermined range. The charge compensator 152 delivers a predetermined amount of charge to the V-gate voltage based on a rising or falling edge transition of the incoming data signal to the predriver.

The V-gate supply block 132 has a charge compensation bit generator 156 and a V-gate generator 158. A single V-gate supply block 132 supplies the V-gate voltage and charge compensation bits for multiple output multiplexors 122. In an alternate embodiment, the V-gate supply block 132 is a part of each output multiplexor 122.

The V-gate generator 158 supplies the V-gate voltage to the predriver 148. The V-gate voltage is different from a supply voltage Vcc. Consequently, the high voltage level of the q-node signal output by the predriver 148 is substantially equal to the V-gate voltage.

The charge compensation bit generator 156 generates charge compensation control signals, also called charge compensation bits, to control the amount of charge delivered by the charge compensator 152 to the V-gate voltage supply.

In the circuit diagrams in this document, the triangular circuit ground symbol is used to indicate the circuit Vss node, and the horizontal bar symbol for the power supply is used to indicate the circuit Vcc node, unless otherwise indicated.

Output Current Driver

Figure 5:
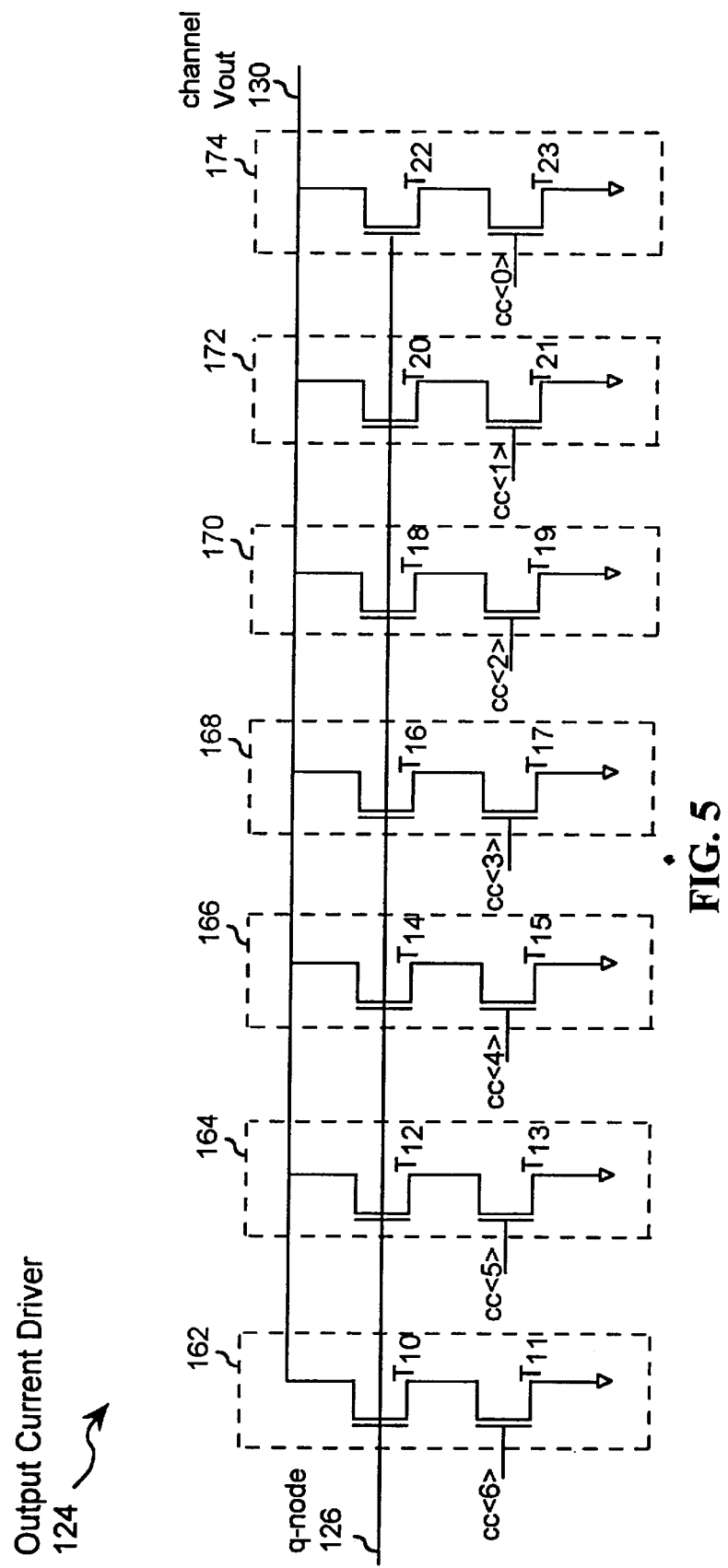
FIG. 5 is a schematic of the output current driver of FIG. 4.

FIG. 5 is a schematic of the output current driver 124 of FIG. 4. The output current driver 124 includes multiple transistor stacks 162–174 connected in parallel between the channel 130 and ground. Each transistor stack 162–174 has two n-type transistors, an upper transistor $T_{10}$, $T_{12}$, $T_{14}$, $T_{16}$, $T_{18}$, $T_{20}$ and $T_{22}$ and a lower transistor $T_{11}$, $T_{13}$, $T_{15}$, $T_{17}$, $T_{21}$, and $T_{23}$, respectively, that are connected in series. The q-node signal is input to the gate of the upper or output drive transistors $T_{10}$, $T_{12}$, $T_{14}$, $T_{16}$, $T_{18}$, $T_{20}$ and $T_{22}$. Current control signals on a set of current control bits, CC<0> through CC<6>, are input to the gate of the lower transistor $T_{11}$, $T_{13}$, $T_{15}$, $T_{17}$, $T_{21}$ and $T_{23}$. When each of the current control signals is at or exceeds the threshold voltage (Vth) of the lower transistor, the corresponding lower transistor $T_{11}$, $T_{13}$, $T_{15}$, $T_{17}$, $T_{21}$ and $T_{23}$ is enabled or "on." When the lower transistor $T_{11}$, $T_{13}$, $T_{15}$, $T_{17}$, $T_{21}$ and $T_{23}$ is enabled and when the q-node signal transitions high (i.e., to its logic high voltage), a predetermined amount of current flows through the transistor stack 162–174 to the circuit ground. Therefore, the output drive current is adjusted by setting a subset of the current control signals to a high voltage level. Preferably, the lower transistors have a low, positive threshold voltage Vt of about 0.3 volts, and more generally in the range of 0.3 to 0.4 volts. Alternately, the lower transistors have a normal threshold voltage Vt of 0.7 volts or ranging from 0.6 to 0.8 volts.

Figure 1:
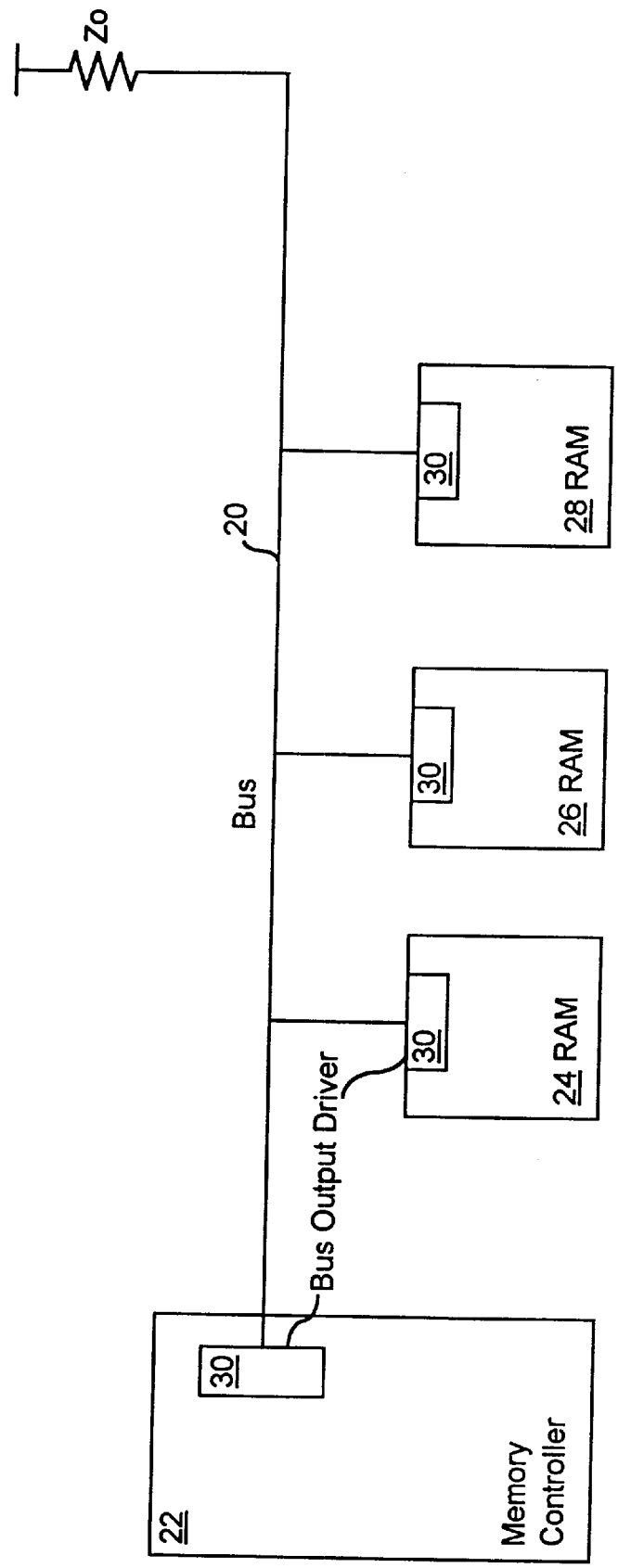
FIG. 1 is a block diagram of a prior art bus connecting a memory controller and RAMS.
Figure 2A:
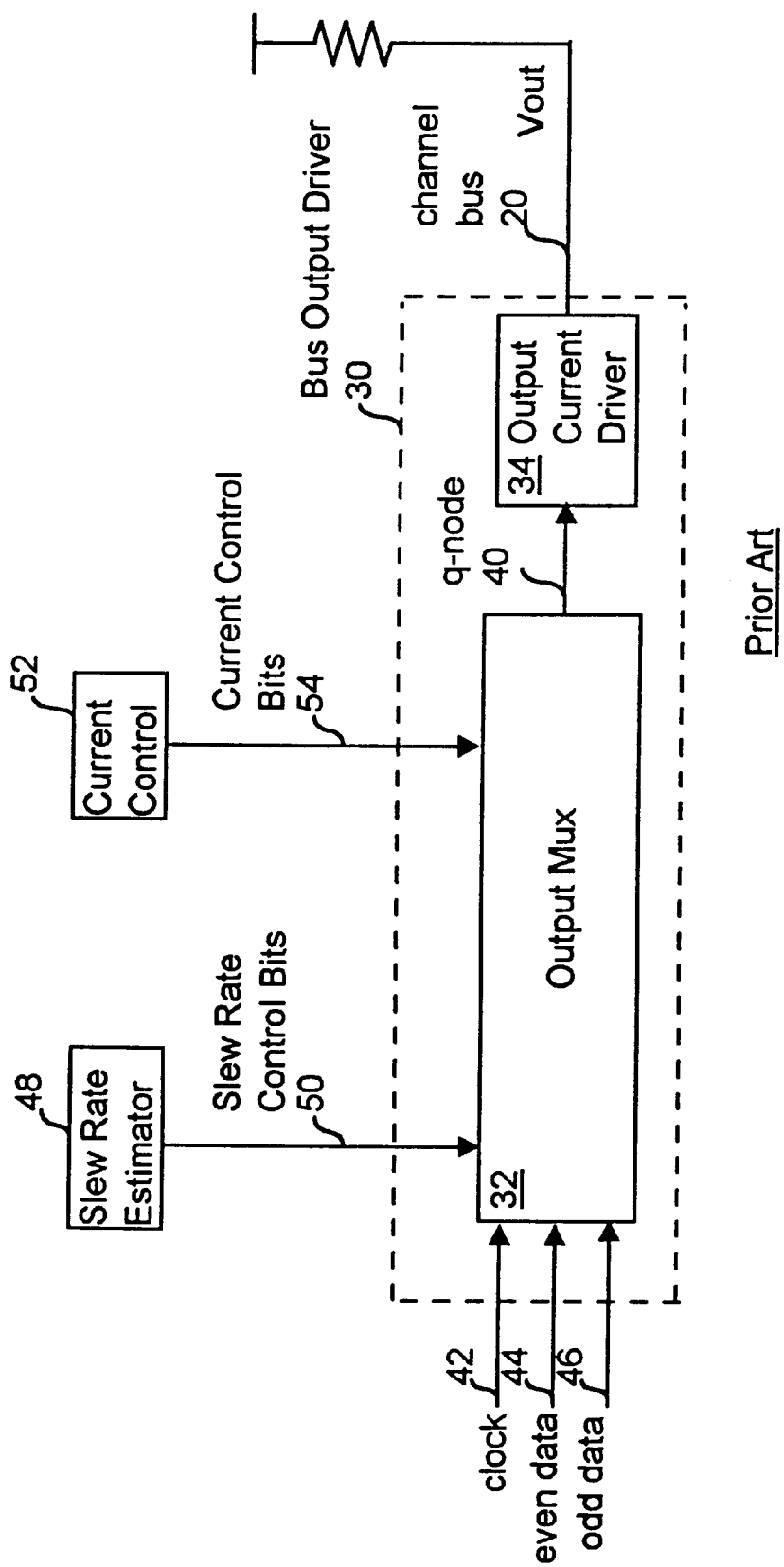
FIG. 2A is a block diagram of a prior art bus output driver with an output multiplexor and output current driver.
Figure 2B:
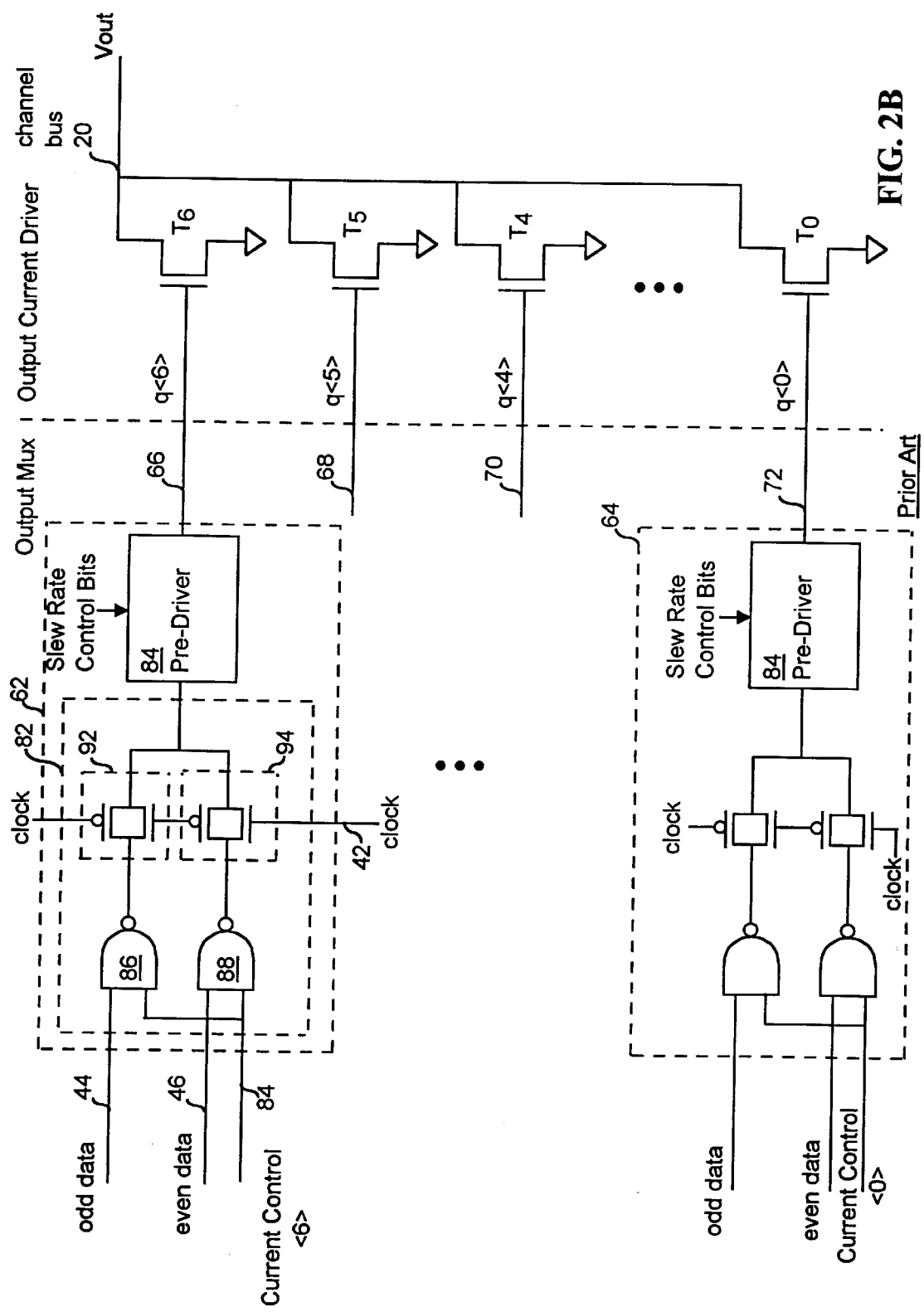
FIG. 2B is a schematic of the prior art output multiplexor and output current driver of FIG. 2A.

To further provide a programmable output drive current, at least one of the transistor stacks 162–174 is binary weighted with respect to at least one other transistor stack 162–174. Preferably the transistor pairs in all the transistor stacks of the output current driver 124 are sized so that the current drive capability of the transistor stacks 162, 164, 166, 168, 170, 172 have current drive ratios of 64:32:16:8:4:2:1, respectively (i.e., are binary weighted). The transistors in the output current driver of the present invention can have a reduced channel length with respect to the prior art output driver of FIG. 2B.

Pre-Driver with Adjustable Slew Rate

Figure 6:
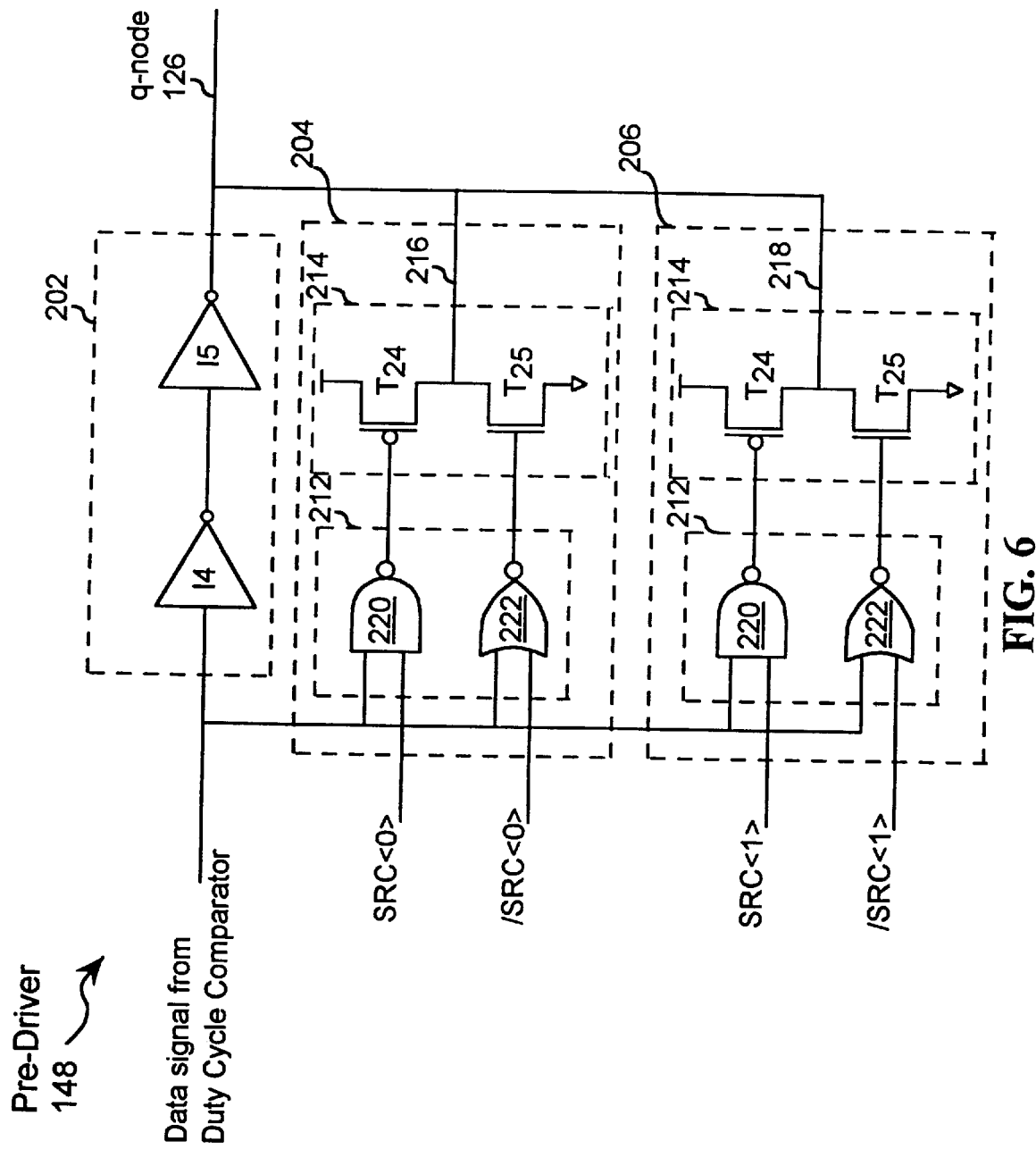
FIG. 6 is a schematic of the pre-driver of FIG. 4.

In FIG. 6, the predriver 148 includes a base block 202 with at least one slew rate adjustment block 204, 206. The base block 202 is always enabled and outputs a q-node signal that has an associated, predetermined slew rate. The base block 202 has two invertors I4, I5 connected in series which are sized to provide both an appropriate slew rate and duty cycle.

At least one controllable slew rate adjustment block 204, 206 is connected in parallel with the base block 202. In one embodiment, the slew rate adjustment blocks 204, 206 each use the same circuit design. The slew rate adjustment blocks 204, 206 have a control block 212 connected in series with a stacked transistor pair 214. The stacked transistor pair 214 has a p-type MOS (p-type) transistor $T_{24}$ connected in series with an n-type transistor $T_{25}$. The outputs 216, 218 of the stacked transistor pairs connect to the q-node 126. The control blocks 212 are responsive to slew rate control signals, SRC<0> and SRC <1>, which enable the stacked transistor pair 214 to be responsive to the data signal from the duty cycle compensator. The control blocks 212 include a NAND gate 220 and a NOR gate 222. The NAND gate 220 enables the p-type transistor $T_{24}$ of the transistor stack 214 and the NOR gate 222 enables the n-type transistor $T_{25}$ of the transistor stack 214.

If both slew rate adjustment blocks 204, 206 have their slew rate control signals set to a high voltage level, the slew rate of the q-node signal at the q-node 126 is greater than if only one slew rate adjustment block has its slew rate control bit set.

In particular, when slew rate control bit zero SRC<0> is at a high voltage level, the NAND gate 220 is enabled to be responsive to the data signal from the duty cycle compensator, allowing the data signal to drive the upper p-type transistor $T_{24}$ of the transistor stack 214. At the same time, when SRC<0> is at a high voltage level, /SRC<0> is at a low voltage level which enables the NOR gate 222 to be responsive to the data signal, allowing the data signal to drive the lower n-type transistor $T_{25}$ of the transistor stack 214.

When the NAND and NOR gates, 220 and 222, respectively, are enabled, and when the data signal from the duty cycle compensator transitions to a low voltage level, a high voltage level appears at the output of the NOR gate 222 that causes the lower n-type transistor $T_{25}$ to conduct current to ground thereby increasing the rate at which the q-node 126 is driven to ground. At substantially the same time that a high voltage level appears at the output of the NOR gate 222, a high voltage level appears at the output of the NAND gate 220 that causes the upper p-type transistor $T_{24}$ to not conduct current or "turn off."

When the NAND and NOR gates, 220 and 222, respectively, are enabled, and when the data signal from the duty cycle compensator transitions to a high voltage level, a low voltage level appears at the output of the NAND 220 gate that causes the upper p-type transistor $T_{24}$ to conduct current thereby increasing the rate at which the q-node 126 is driven to a high voltage level. At substantially the same time as a low voltage level appears at the output of the NAND gate 220, a low voltage level appears at the output of the NOR gate 222 that causes the lower n-type transistor $T_{25}$ to turn off. When SRC<0> is at a low voltage level and /SRC<0> is at a high voltage level, the NAND and NOR gates, 220 and 222 respectively, are not responsive to the data signal and are thereby disabled. Therefore, the transistor stack 214 is not responsive to the incoming data signal.

In one embodiment, one slew rate adjustment block 204 increases the slew rate by 0.5 with respect to the base block 202, while the other slew rate adjustment block increases the slew rate by 1.5 with respect to the base block 202. However, the slew rate adjustment blocks 204, 206 can provide other predetermined amounts of adjustment to the slew rate.

Figure 2C:
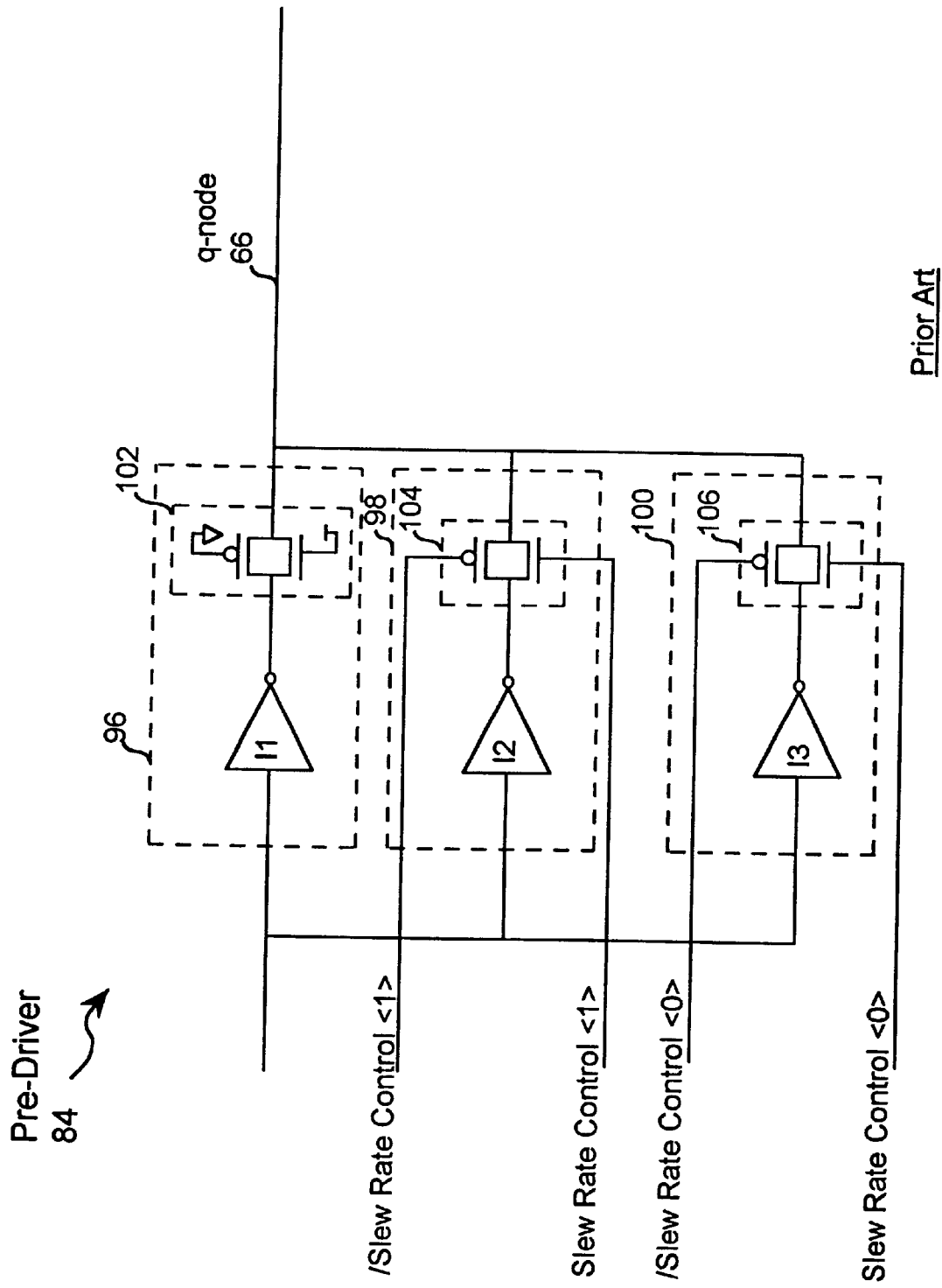
FIG. 2C is a schematic of a prior art pre-driver of FIG. 2B.

Comparing the pre-driver 148 of the present invention with the prior art circuit of FIG. 2C, it is noted that the pre-driver 148 of the present invention has just one transistor between the pre-driver's power supply and the q-node 126 output, while there are two transistors (one for the driver inverter and one for the pass gate) in the prior art version. As a result, drive transistors in the pre-driver 148 of the present invention can be smaller than those of the prior art for the same speed of operation, and their behavior in the linear region of operation can be more easily controlled.

The slew rate adjustment blocks 204, 206 are sized to provide an appropriate slew rate without regard to the duty cycle to increase the range for each setting of the slew rate control bits. Therefore, activating the slew rate adjustment blocks will cause asymmetry in the duty cycle at in the output voltage Vout. The duty cycle compensator 146, discussed below, compensates for this asymmetry.

Kickdown Circuit

Figure 7A:
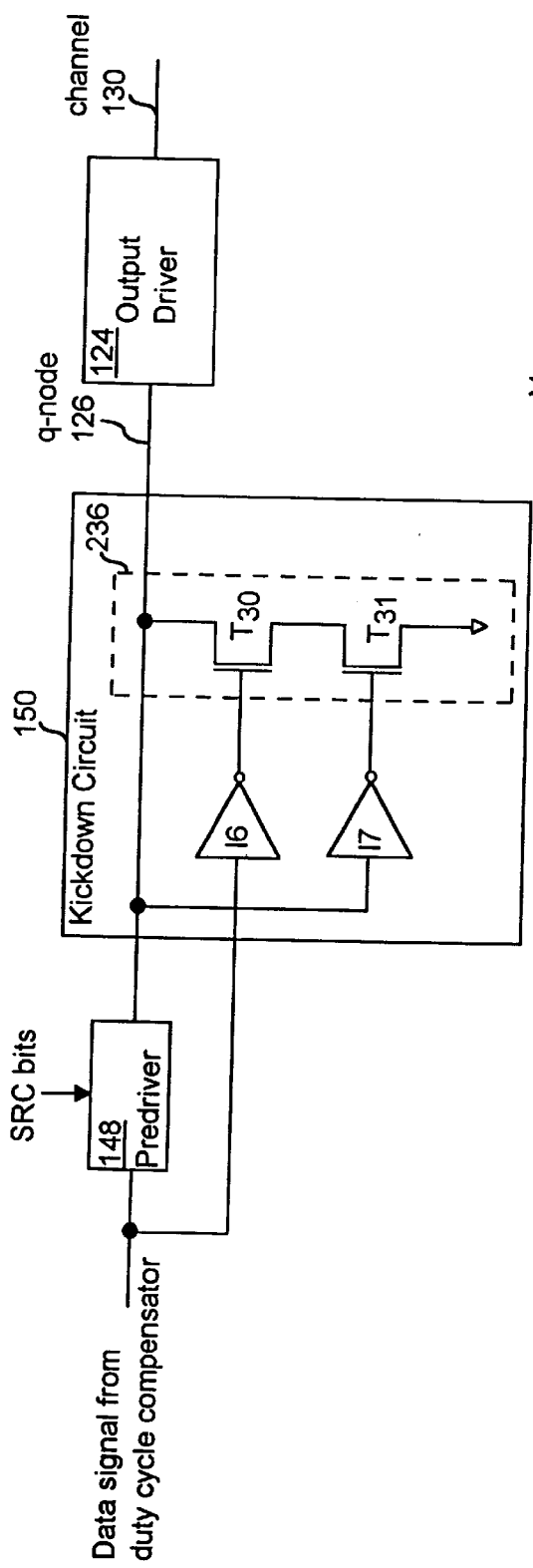
FIG. 7A is a schematic of the kickdown circuit of FIG. 4.

FIG. 7A is a schematic of the kickdown circuit 150 of FIG. 4. The kickdown circuit 150 aids the predriver 148 in driving the q-node signal to ground or Vss. The kickdown circuit 150 connects in parallel with the predriver 148. The kickdown circuit 150 detects a falling edge transition of the q-node signal on the q-node 126, then pulls the charge from the q-node 126 to ground (Vss) thereby increasing the rate at which the q-node 126 approaches Vss (ground), thereby assuring that the q-node signal swings fully to ground.

In the kickdown circuit 150, one transistor $T_{30}$ is responsive to the incoming data signal to the predriver 148 via inverter 16. The other transistor $T_{31}$ is responsive to the q-node signal being output by the predriver 148 via inverter 17.

The kickdown circuit 150 looks ahead to the incoming data to identify the next data transition. When the q-node signal at the q-node 126 is at a high voltage level the lower transistor $T_{31}$ is off. When the incoming data signal to the predriver 148 is at a low voltage level, the upper transistor $T_{30}$ is on. As the q-node signal transitions to the incoming low voltage level, the lower transistor $T_{31}$ turns on and conducts current to ground.

Figure 7B:
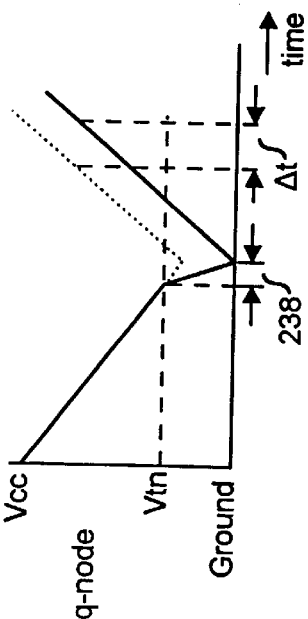
FIG. 7B depicts the waveform of the q-node signal during a transition from a high voltage level, Vcc, to the low voltage level, ground, using the kickdown circuit of FIG. 7A.

FIG. 7B depicts the waveform of the q-node signal during a transition from a high voltage level Vcc (or V-gate as will be seen with reference to FIG. 9) to the low voltage level, ground. The solid line depicts the q-node signal using the kickdown circuit. The dotted line depicts the q-node signal without the kickdown circuit. Δt is the time difference between complete and incomplete voltage swings between Vcc and ground for the q-node signal. Vtn is the threshold voltage for the nmos device receiving the q-node signal in the output current driver, and is equal to about 0.7 volts.

When the incoming data signal to the predriver is at a low voltage level (and thus turning on transistor $T_{30}$) and the q-node signal transitions from a high voltage level past the "crossover" voltage $V_x$ of inverter 17, inverter 17 will output a sufficiently high voltage to turn on transistor $T_{31}$. The cross-over voltage Vx of the inverter 17 depends on the ratio of the transistors in the inverter, and is preferably set so that transistor $T_{31}$ turns on when the q-node signal is about equal to the transistor threshold voltage Vtn. In one embodiment, the crossover voltage Vx is equal to about 0.5 times the supply voltage, Vcc.

When both transistors $T_{30}$, $T_{31}$ of the kickdown circuit are on and conducting current, the rate at which the q-node signal transitions to the circuit ground voltage level is increased as shown in region 238.

When the incoming data signal to the predriver 148 is at a high voltage level, the kickdown circuit 150 is not enabled because transistor $T_{30}$ is "off".

This technique obtains a full voltage swing between Vcc and ground on the q-node signal without disturbing the slew rate of the q-node, and thus also Vout, as controlled by the predrivers. Full swings are important to guarantee constant delays through the output current driver 124. When the voltage swings of the q-node signal are not full, data dependent delays occur and produce data dependent jitter of the magnitude of Δt shown in FIG. 7B.

Duty Cycle Compensator

Figure 8:
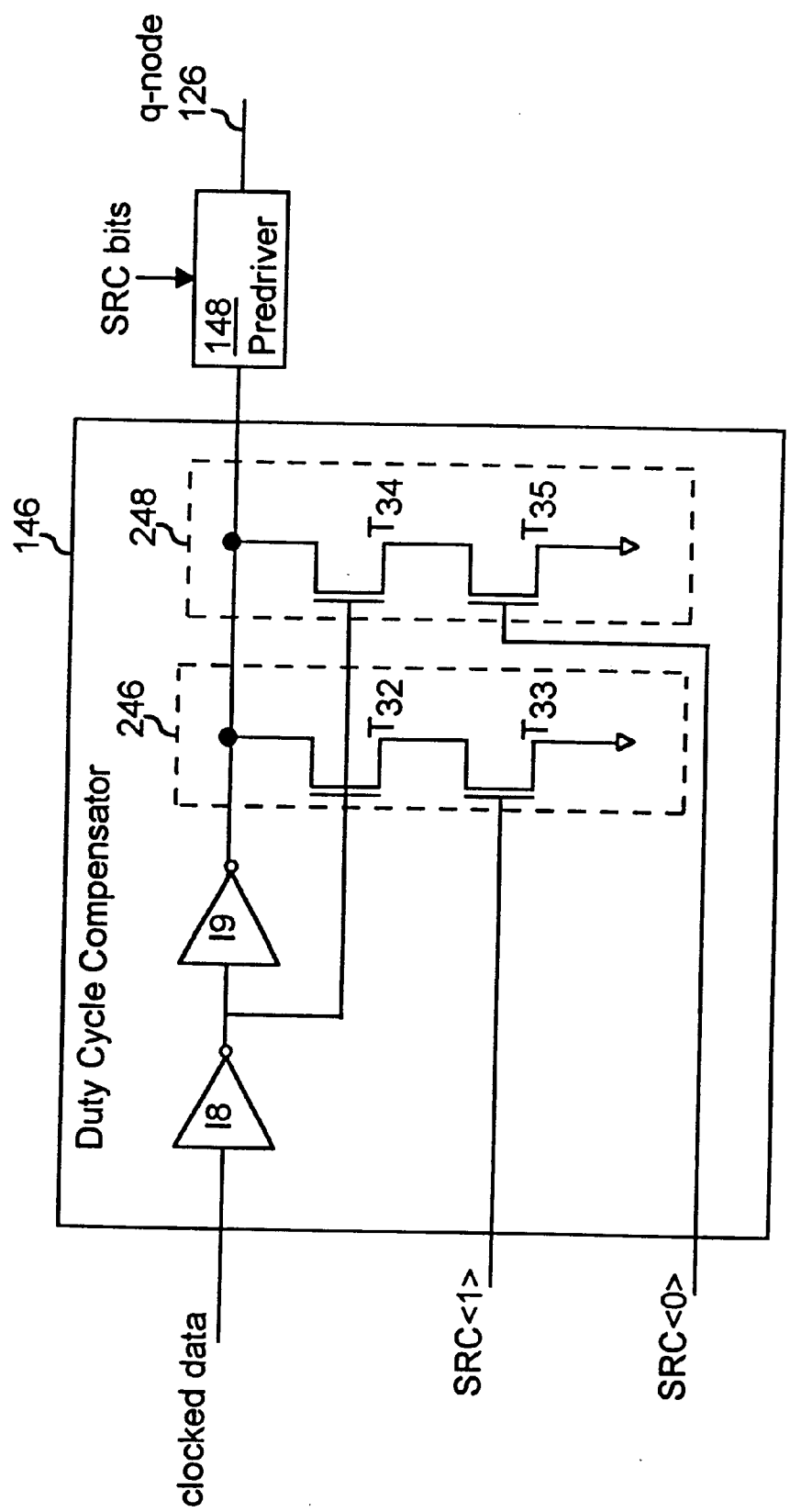
FIG. 8 is a schematic of the duty cycle compensator of FIG. 4.

FIG. 8 is a schematic of the duty cycle compensator 146 of FIG. 4. The duty cycle compensator 146 pre-compensates for distortion of the duty cycle caused by the slew rate control blocks of the predriver 148 when the slew rate control (SRC) signals, SRC<1> and SRC<0>, are enabled. In response to the slew rate control signals on the SRC bits, the duty cycle compensator 146 pre-compensates the data signals being input to the predriver 148 such that the distortion caused by the predriver 148 is canceled out in the q-node signal at the q-node 126. In other words, the duty cycle compensator 146 modifies the duty cycle of the clocked data signal by a predetermined amount in response to the slew rate control signals.

The duty cycle compensator 146 has a pair of series-connected invertors I8, I9 and two transistor stacks 246, 248. The transistor stacks 246, 248 have two n-type transistors $T_{32}$, $T_{33}$, $T_{34}$, $T_{35}$ connected in series between the input to the predriver 148 and ground. The input to the upper transistor $T_{32}$, $T_{34}$ is the signal output by the first inverter 18. The slew rate control bits connect to the gate of the lower transistors $T_{33}$ and $T_{35}$. A high voltage level on the slew rate control bits enables the stacked transistors 246, 248 to adjust the duty cycle of the clocked data signal, by increasing the slew rate of high-to low transitions on the input to the predriver 148. A low voltage level on the slew rate control bits disables the stacked transistors 246, 248 and prevents the duty cycle of the clocked data signal from being modified.

To increase the range for each setting of the slew rate control bits, the transistors $T_{24}$ and $T_{25}$ (FIG. 6) of the slew rate control blocks are sized such that the rise and fall times of Vout are within a certain range, regardless of the duty cycle. Therefore, activating the slew rate control bits will cause asymmetry in the duty cycle of Vout. It is worthwhile to note that when Vout has a fifty percent duty cycle, the q-node signal does not have a fifty percent duty cycle.

Regulating the Q-node Voltage

Figure 9:
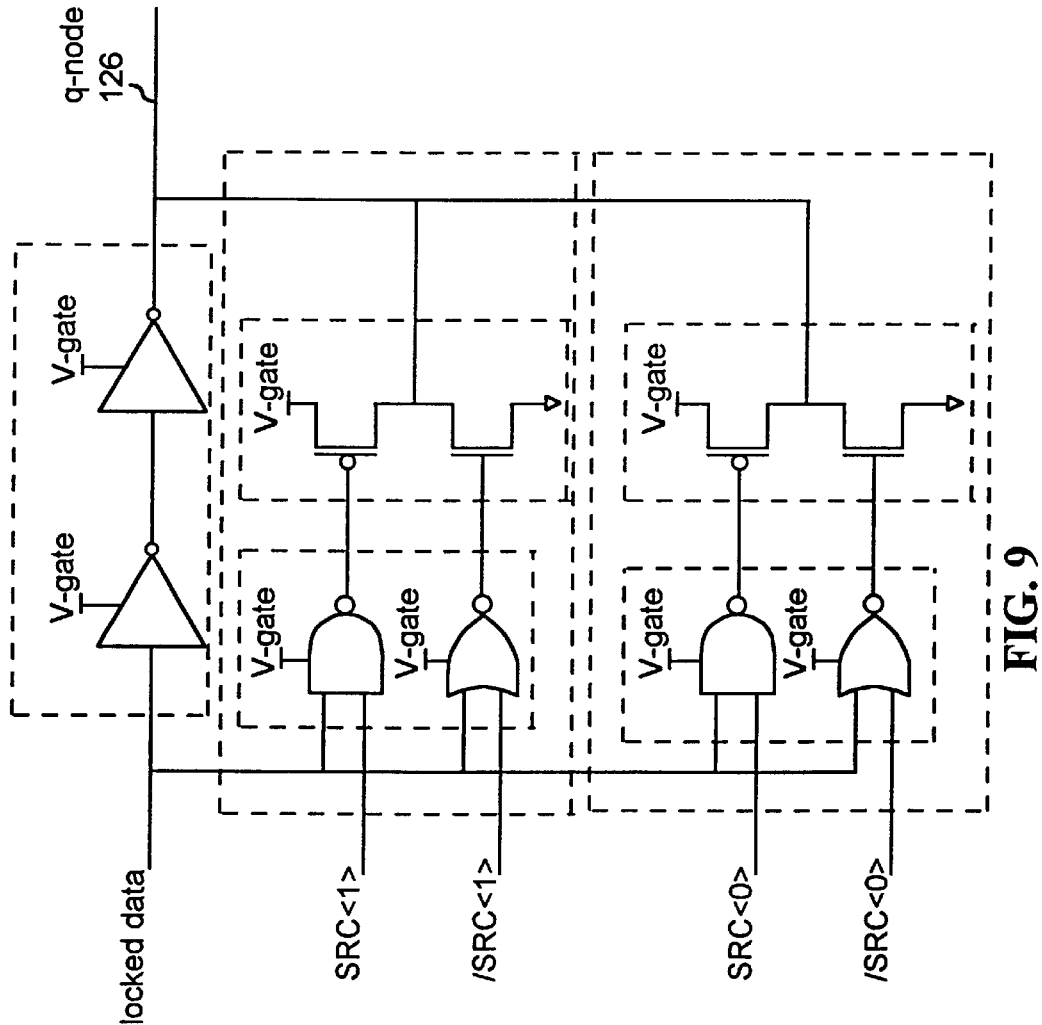
FIG. 9 is a schematic of a preferred embodiment of the pre-driver of FIG. 4.

FIG. 9 is a schematic of a preferred embodiment of the predriver 148 of FIG. 4. The only difference between the predriver of FIG. 9 and FIG. 4 is that the predriver of FIG. 9 is powered by a V-gate supply voltage instead of the conventional power supply voltage Vcc. The V-gate supply voltage is a regulated voltage and is chosen such that the output drive transistor of the output current driver 124 operates at the edge of saturation and causes the output impedance to exceed 150 ohms. In this way, the q-node signal on the q-node 126 varies from a low level of about zero volts to a high level of about V-gate. In one preferred embodiment in which Vcc is equal to about 2.5 volts, V-gate is equal to about 1.4 to 1.5 volts.

The output impedance exceeds 150 ohms for an range of supply voltages from 2.25 volts to 2.75 volts, for a range of temperatures from about 0° C. to 110° C., and for a range of expected variation in transistor performance variation.

When using the V-gate voltage to supply power to the predriver 148, the V-gate voltage may also, in some embodiments, be provided to a slew rate estimator (which may be external to the bus output driver) so that the slew rate estimator can more accurately predict the operation of the predriver 148.

Figure 10A:
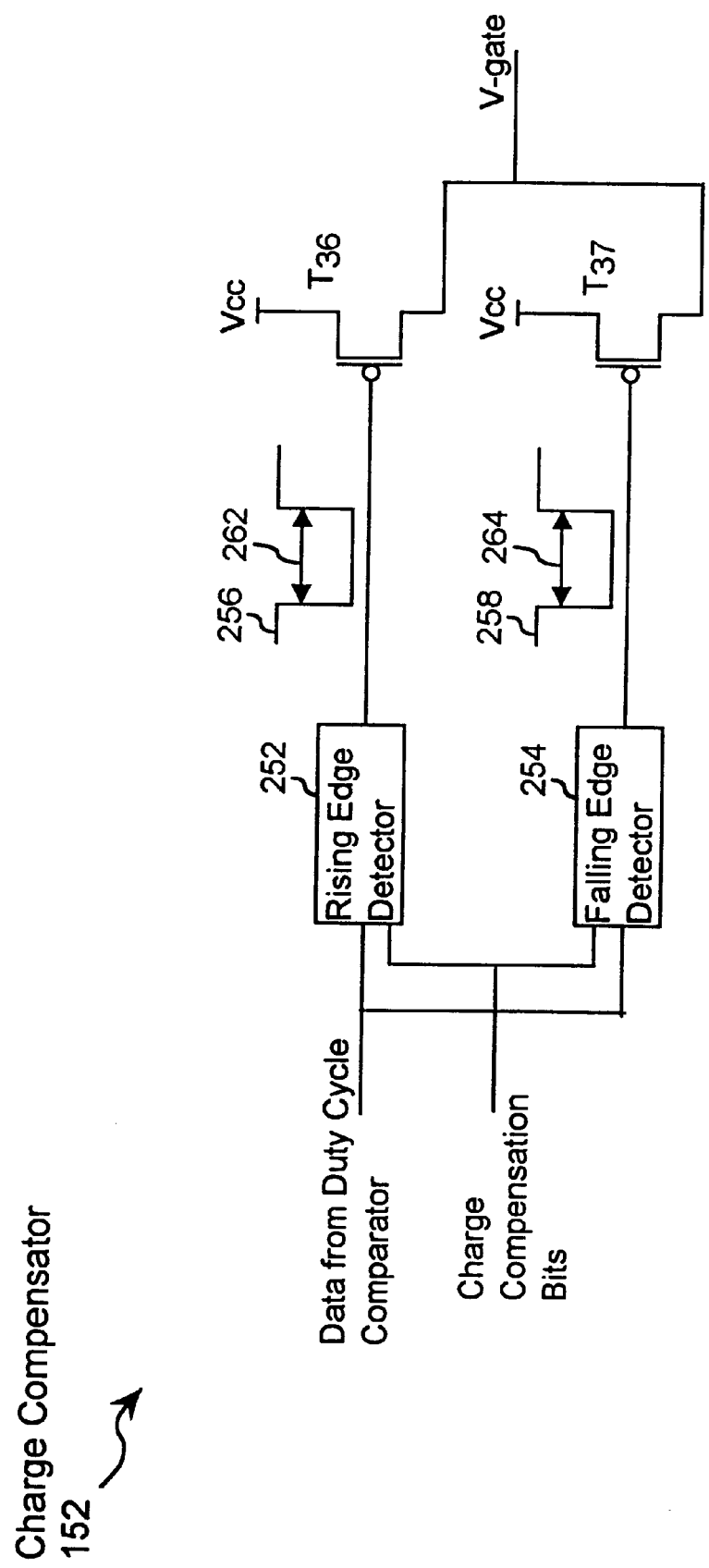
FIG. 10A is a diagram of the charge compensator of FIG. 4.

FIG. 10A is a diagram of the charge compensator 152 of FIG. 4. The charge compensator 152 reduces fluctuations in the V-gate voltage. The amount of charge drawn by the predriver from the V-gate supply depends on whether the q-node signal is rising or falling and causes the V-gate voltage to fluctuate. To reduce fluctuations in the V-gate voltage, the charge compensator 152 has a rising edge detector 252 and a falling edge detector 254. The detectors 252, 254 deliver a different amount of charge to the V-gate voltage supply line depending on whether the incoming data transition has a rising or a falling edge. The rising and falling edge detectors 252 and 254 output a negative pulse, 256 and 258, respectively, when they detect their 30 respective edges. The negative pulses 256, 258 turn on p-type transistors $T_{36}$ and $T_{37}$ causing current to flow from the supply voltage Vcc to the V-gate voltage supply line for the duration of the pulse width 262, 264. $T_{36}$ and $T_{37}$ are sized to reflect the different amounts of charge compensation to be used for the rising and falling edges, respectively. In a preferred embodiment, $T_{36}$ is a 53 micron/0.25 micron p-channel transistor and $T_{37}$ is a 30 micron/0.25 micron p-channel transistor, both having a threshold voltage of about 0.7 volts.

In a preferred embodiment, charge compensation signals on charge compensation bits are also input to the rising and falling edge detectors, 252 and 254, respectively. The charge compensation signals selectively adjust the amount of charge output by the edge detectors 252, 254.

Figure 10B:
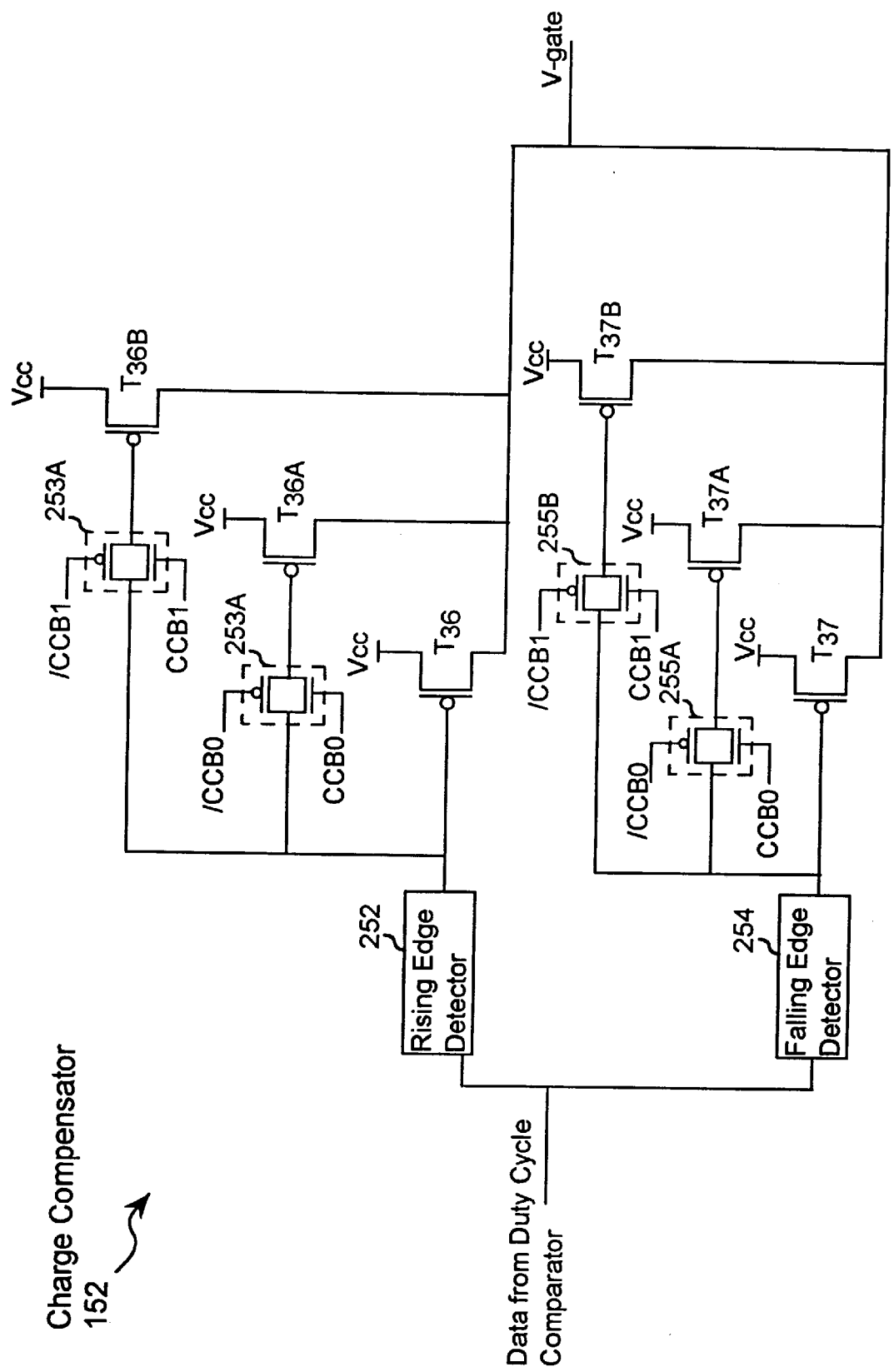
FIG. 10B is a schematic of an alternate embodiment of the charge compensator of FIG. 10A and uses a fixed width pulse to adjust the charge on the V-gate supply.

The amount of charge from the charge compensator can be adjusted in several ways. For example, the circuit of FIG. 10B is similar to FIG. 10A and uses a fixed width pulse to adjust the charge on the V-gate supply. The charge compensation bits (CCB0 and CCB1) enable additional transistors $T_{36A}$, $T_{36B}$, $T_{37A}$, $T_{37B}$, that are connected in parallel with transistors $T_{36}$ and $T_{37}$, respectively, to provide additional current to the V-gate supply when the corresponding charge compensation bits, CCB0 and CCB1, are equal to "1". In FIG. 10B, /CCB0 and /CCB1 are the complement of CCB0 and CCB1 and are generated from CCB0 and CCB1 using an inverter (not shown).

Figure 10C:
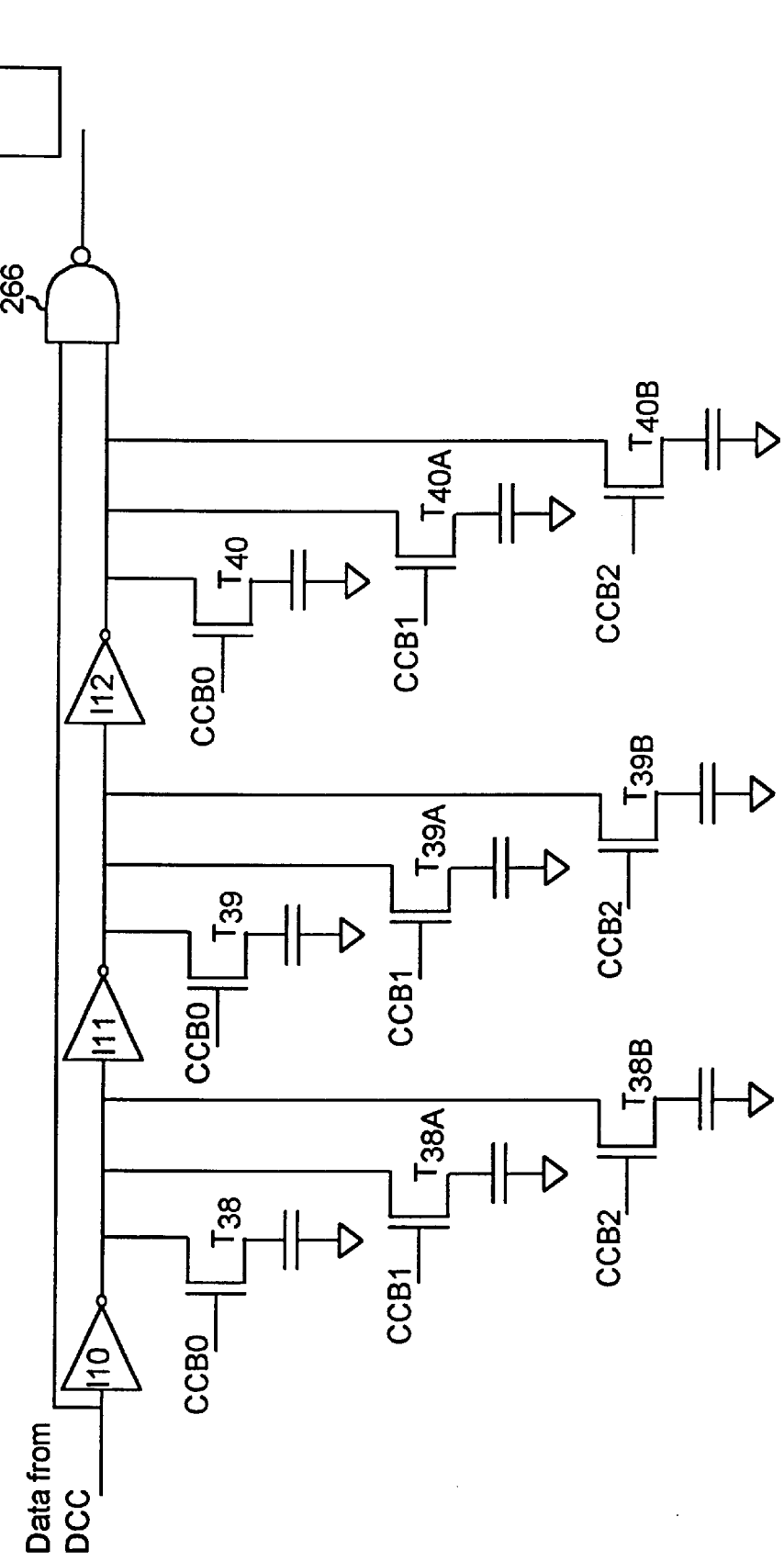
FIG. 10C is a schematic of one embodiment of the rising edge detector of FIG. 10A.

Other embodiments adjust the amount of charge by varying the length of the pulses. In a preferred embodiment of the rising edge detector, shown in FIG. 10C, the input data signal from the Duty Cycle Compensator (DCC) is supplied to a NAND gate 266 both directly and through an odd number of invertors I10, I11, I12 to generate a pulse. The charge compensation bits control transistors $T_{38}$, $T_{39}$, $T_{40}$, $T_{38A}$, $T_{39A}$, $T_{40A}$, $T_{38B}$, $T_{39B}$, $T_{40B}$, to selectively add capacitors to increase the amount of delay of the input data signal through the inverter string and thereby increase the output pulse width from the NAND gate 266. In this embodiment, a single charge compensation bit enables or disables multiple transistors, thus distributing the capacitive load and the delay. A falling edge detector can be implemented in a similar manner.

Figure 10D:
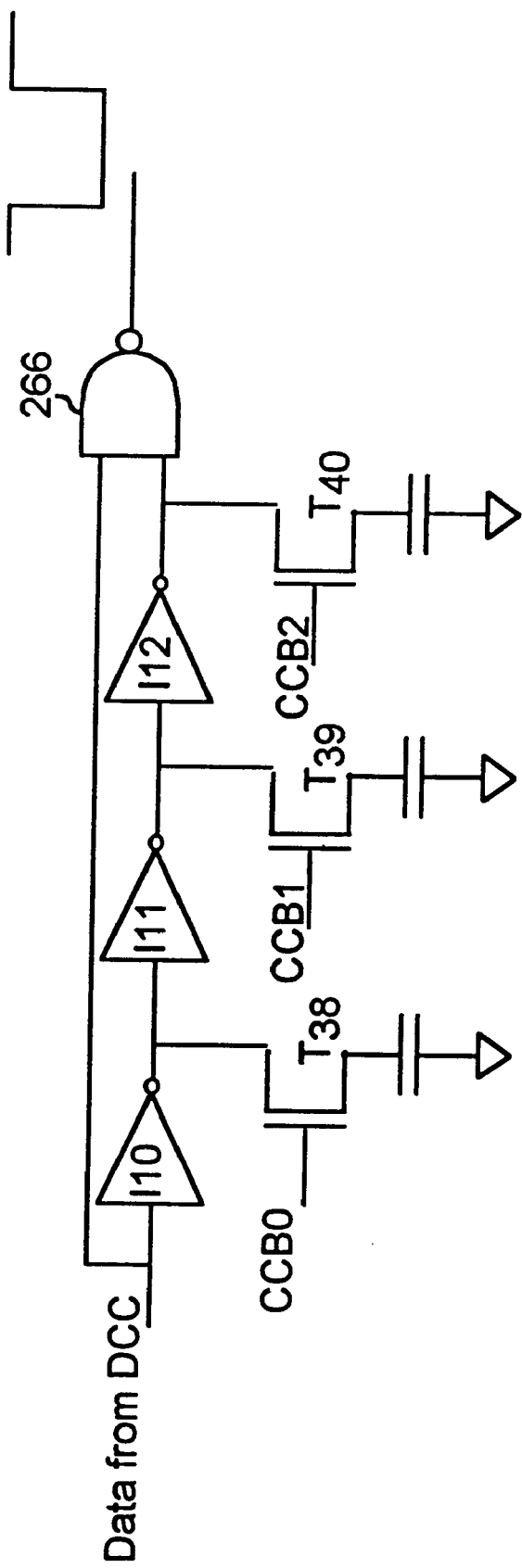
FIG. 10D is a schematic of an alternate embodiment of the rising edge detector of FIG. 10A.

Another embodiment of the rising edge detector is shown in FIG. 10D. The embodiment shown in FIG. 10D is similar to the embodiment shown in FIG. 10C. The input data signal from the duty cycle compensator is supplied to an inverter I10.

In this embodiment, each charge compensation bit CCB0, CCB1, CCC2 enables a single transistor-capacitor pair that is connected to the output of each inverter I10, I11 and I12, respectively. A falling edge detector can be implemented in a similar manner.

Figures 10E, 10F:
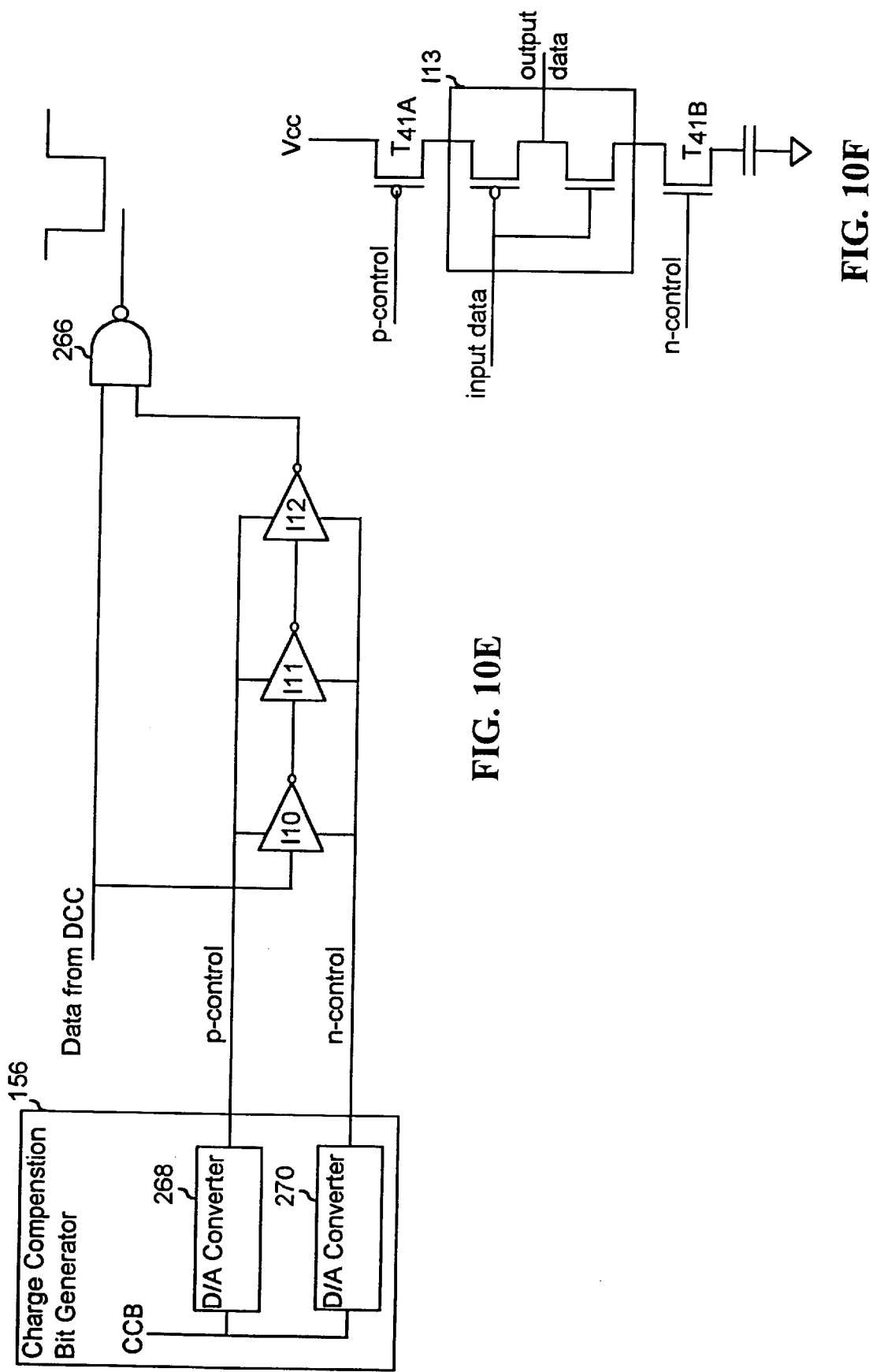
FIG. 10E is a schematic of an alternate embodiment of the rising edge detector and charge compensation bit generator of FIG. 10A and FIG. 4, respectively.
FIG. 10F is a schematic of the tri-state inverters of FIG. 10E.

FIG. 10E is another embodiment of the charge compensator of FIG. 10A. In this embodiment, the charge compensation bit generator 156 has digital to analog (D/A) converters 268, 270 that convert the charge compensation bits to p-control and n-control signals, respectively. The control and n-control signals are analog signals. The inverters I10, I11 and I12 are tri-state inverters and are responsive to the p-control and n-control signals. Each tri-state inverter I10, I11 and I12 delays the signal by an amount in response to the p-control and n-control signals.

Referring also to FIG. 10F, a schematic of the inverters I10, I11 and I12 of FIG. 10E is shown. A pmos transistor $T_{41A}$ and an nmos transistor $T_{41B}$ are connected between the power supply Vcc and ground of an inverter I13. The p-control and n-control signals control the amount of current passed through transistors $T_{41A}$ and $T_{41B}$, respectively, thereby controlling the amount of delay of the output data of inverter I13 with respect to the input data.

Figures 10G, 10H:
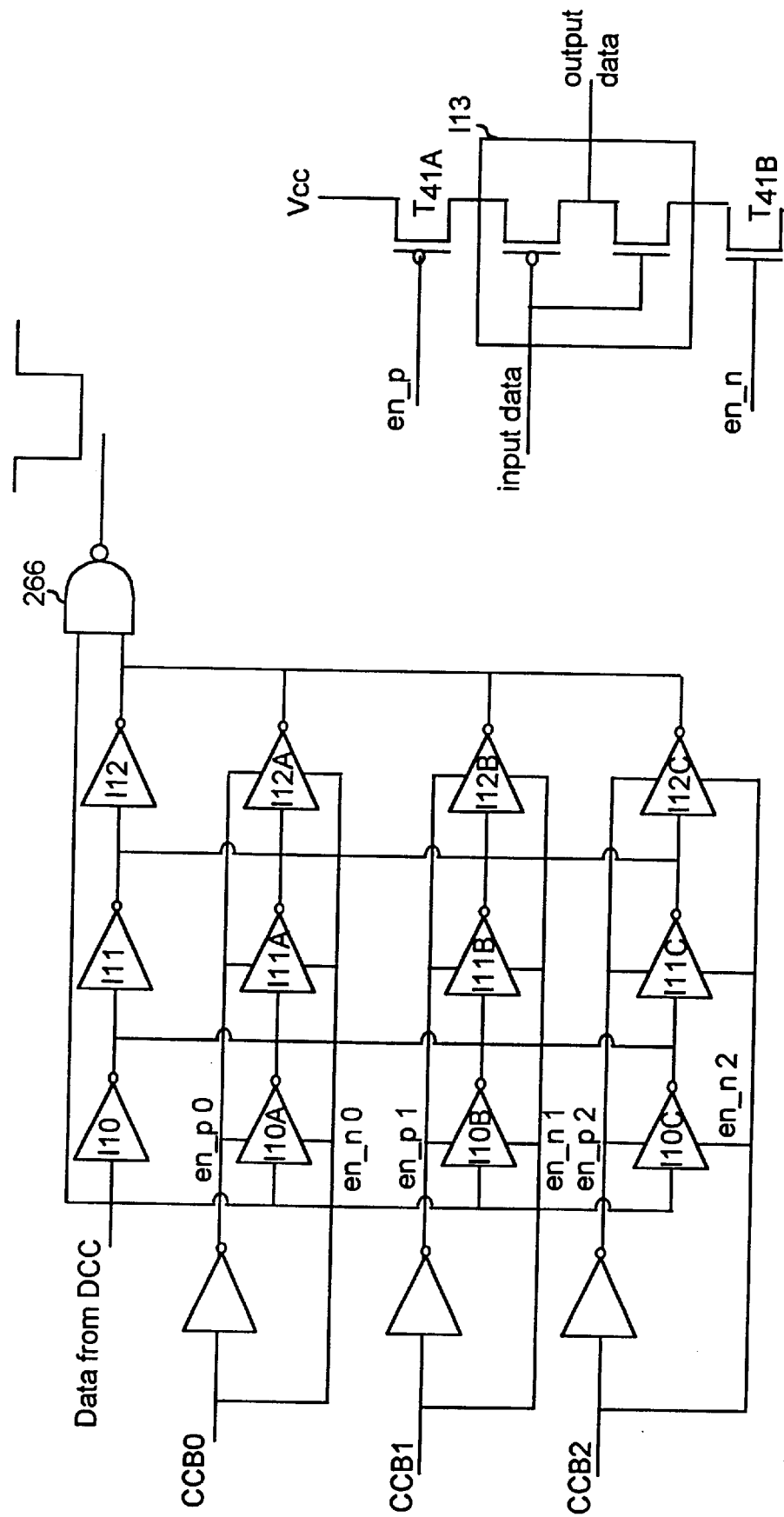
FIG. 10G is a schematic of another alternate embodiment of the rising edge detector of FIG. 10A.
FIG. 10H is a schematic of the tri-state inverters of FIG. 10G.

In FIG. 10G, yet another embodiment of the rising edge detector of FIG. 10A is shown. Inverters I10, I11 and I12 connect in parallel to multiple tri-state inverters. For example, inverter I10 connects in parallel to inverters I10A, I10B and I10C. Each charge compensation bit (CCB0, CCB1 and CCB2) enables or disables a row of tri-state inverters. Note that inverters I14, I15 and I16 generate the complement of CCB0, CCB1 and CCB2, as the en_p 0, en_p 1 and en_p 2 signals, respectively.

Referring also to FIG. 10H, a schematic of the tri-state inverters I10A, I11A, I12A, I10B, I11B, I12B, I10C, I11C and I12C of FIG. 10G is shown. The embodiment shown in FIG. 10H is similar to the embodiment shown in FIG. 10F. However, instead of having analog signals p-control and n-control, digital signals en_p and en_n control transistors $T_{41A}$ and $T_{41B}$, respectively, thereby turning the transistors $T_{41A}$, $T_{41B}$ on or off.

For example, CCB0 and its complement output by inverter I14 connect to inverters I10A, I11A and I12A via the en_n 0 and the en_p 0 inputs to enable or disable inverters I10A, I11A and I12A. When CCB0 is at a high voltage level, en_n is at a high voltage level and en_p is at a low voltage level, thereby turning on transistors $T_{41A}$ and $T_{41B}$, respectively, and reducing the amount of delay and output pulse width. When CCB0 is at a low voltage level, en_n is at a low voltage level and en_p is at a high voltage level, thereby turning off transistors $T_{41A}$ and $T_{41B}$, respectively, and leaving the amount of delay and output pulse width unchanged.

Figures 11A, 11B:
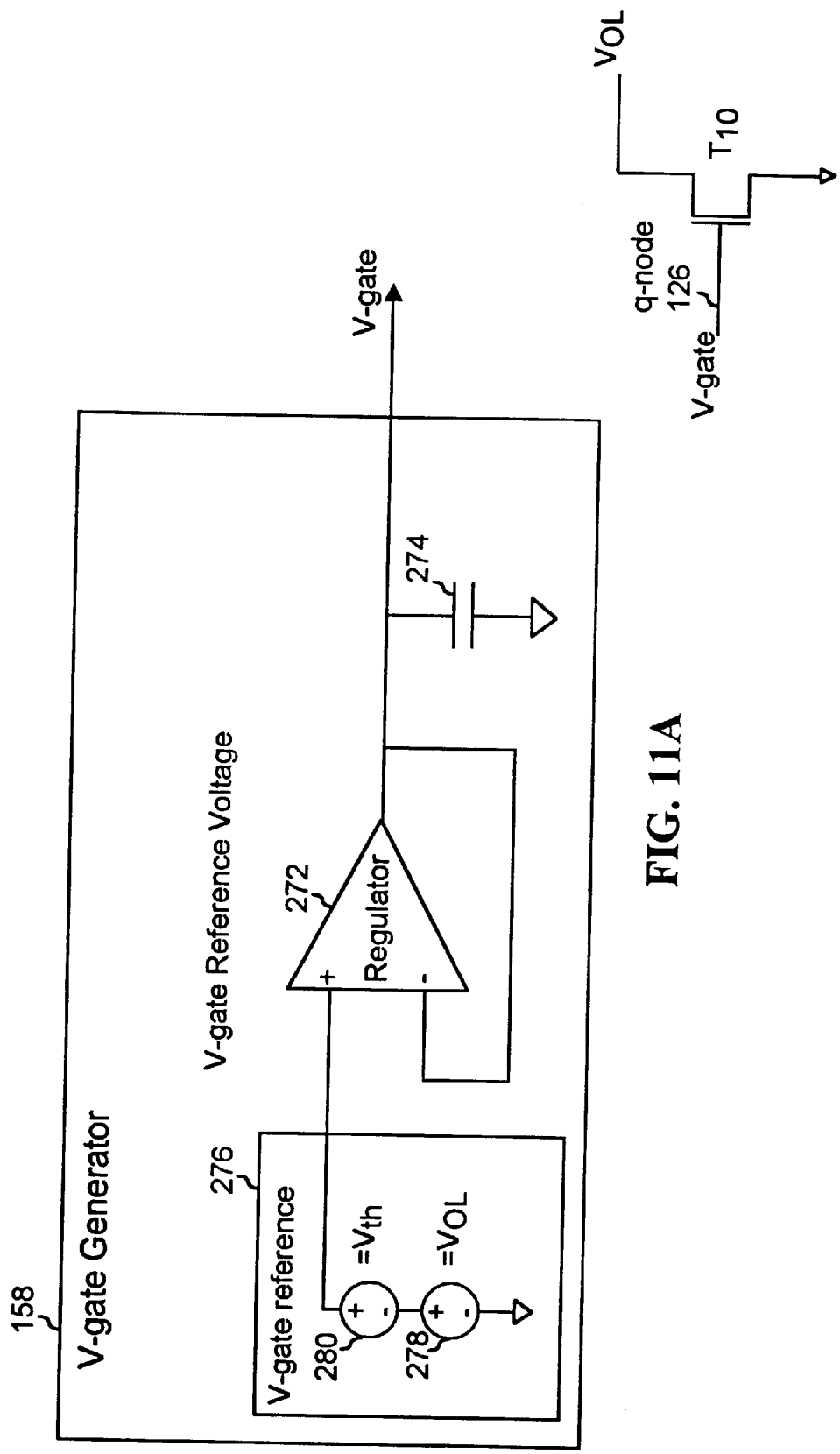
FIG. 11A is a schematic of the V-gate generator of FIG. 4.
FIG. 11B is a model circuit used to determine the value of V-gate that is output by the V-gate generator of FIG. 11A.

FIG. 11A is a schematic of the V-gate generator 158 of FIG. 4. The V-gate generator 158 has a regulator 272, a capacitor 274 and a V-gate reference voltage generator 276. The regulator 272 is an operational amplifier configured to match the V-gate voltage to the V-gate reference voltage. The capacitor 274 reduces fluctuations in the V-gate supply voltage during periods of large current demands until the regulator 272 responds.

The V-gate reference voltage generator 276 produces the V-gate reference voltage that is input to the regulator 272. The V-gate reference voltage is chosen such that the output drive transistors of the output current driver remain on the edge of saturation when the output current driver is driving a signal with a low voltage level.

FIG. 11B shows an exemplary model circuit including the output drive transistor $T_{10}$. Output drive transistor $T_{10}$ is also shown in FIG. 5, and the following description assumes that the current control signal for the output drive transistor $T_{10}$ is set such that the source of $T_{10}$ is at ground. When outputting or driving a low voltage level $V_{OL}$ to the channel, the predriver drives the q-node signal at the gate of $T_{10}$ to the V-gate voltage level. The drain of $T_{10}$ will then reach the $V_{OL}$ voltage. To keep $T_{10}$ in saturation, V-gate minus the threshold voltage (Vth) of $T_{10}$ is less than or equal to the channel voltage, $V_{OL}$. The following equation describes the relationship:

$$\text{V-gate} - \text{Vth} \leq V_{OL},$$

which is equivalent to:

$$\text{V-gate} \leq V_{OL} + \text{Vth}.$$

Since lower values of V-gate require larger dimensions for the output drive transistor, $T_{10}$, the maximum desirable voltage for V-gate is substantially equal to $V_{OL}+\text{Vth}$. Operating the output drive transistor $T_{10}$ at the edge of saturation causes the output drive transistor $T_{10}$ to maintain a high output impedance substantially equal to or exceeding about 150 ohms, while keeping the size of the output drive transistor $T_{10}$ reasonably small.

In a preferred embodiment, $V_{OL}$ is equal to about 0.8 volts, and the output transistor $T_{10}$ is an n-channel transistor having a threshold voltage of about 0.7 volts.

Referring back to FIG. 11A, an ideal V-gate reference generator 276 is shown. The V-gate reference generator has two voltage sources. One voltage source 278 generates a voltage substantially equal to $V_{OL}$. The other voltage source 280 generates a voltage substantially equal to the threshold voltage, Vth, of the output drive transistor, $T_{10}$.

Figure 11C:
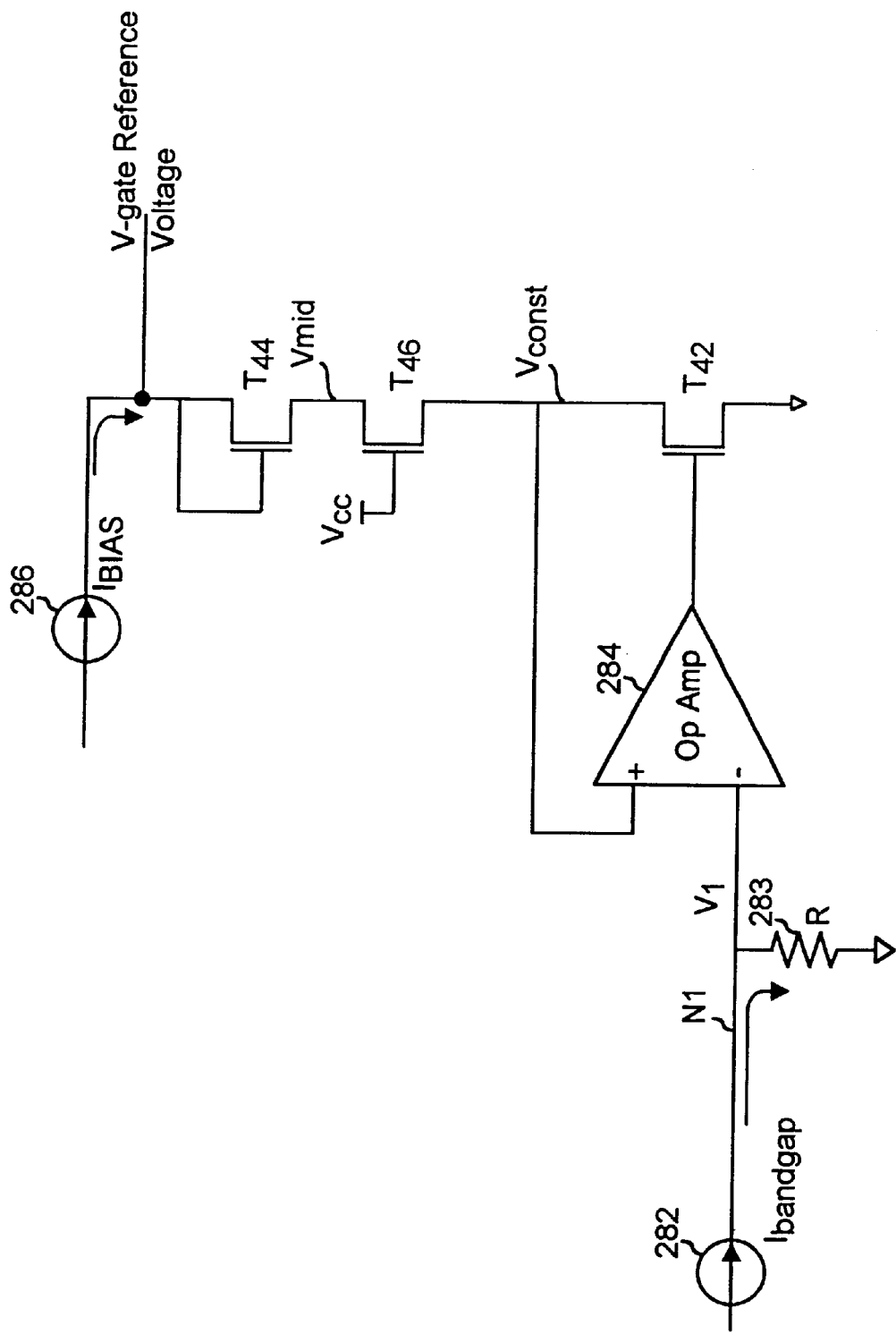
FIG. 11C is a schematic of a V-gate reference voltage generator of FIG. 11A.

FIG. 11C is a schematic of one embodiment of the V-gate reference generator 276 of the V-gate generator of FIG. 11A. In one embodiment, the lower voltage source 278 of FIG. 11A comprises a bandgap current source 282, a resistor 283 with resistance R, an operational amplifier 284 and a transistor $T_{42}$. A current, $I_{bandgap}$, from the bandgap reference current source 282 is dropped across resistor 283. The current $I_{bandgap}$ and the resistance R of the resistor 283 are chosen such that the resulting voltage V1 at node N1 substantially equals the low level output voltage of the channel, $V_{OL}$. Variations in the resistance R of the resistor 283 will be canceled by $I_{bandgap}$ because the bandgap current source 282 is designed to change $I_{bandgap}$ in inverse proportion to the resistance R of resistor 283, using techniques well known to those skilled in the art of designing bandgap references. The operational amplifier 284 or regulator along with n-type transistor $T_{42}$ drives the Vconst node to the voltage level V1 which substantially equals $V_{OL}$.

Transistor $T_{44}$ represents the upper voltage source 280 of FIG. 11A. Another current source 286 generates a current called $I_{bias}$ which does not vary with resistance or temperature. The current $I_{bias}$ flows through transistor $T_{44}$. Transistor $T_{44}$ is an n-type transistor tied as a diode. Transistor $T_{44}$ is sufficiently large with respect to $I_{bias}$ such the drain to sour e voltage across $T_{44}$ is close to the threshold voltage Vth of $T_{44}$.

Unfortunately, the currents, $I_{bandgap}$ and $I_{bias}$, vary with voltage. This variance causes the V-gate reference voltage to be slightly higher than desired when the supply voltage Vcc is higher than its nominal value, and lower than desired when the supply voltage Vcc is lower than its nominal value.

To reduce this variation, in a preferred alternate embodiment, the lower voltage source 278 of FIG. 11A also includes transistor $T_{46}$. Transistor $T_{46}$ is an n-type transistor with its gate tied to the supply voltage Vcc. In this alternate embodiment, the voltage output as -from voltage source 278 equals the voltage at node Vmid, which is substantially equal to $V_{OL}$ plus the drain to source voltage (Vds) across $T_{46}$. The drain to source voltage Vds across $T_{46}$ will vary with Vcc. For a range of high supply voltages, Vcc, the drain to source voltage Vds of $T_{46}$ will decrease slightly. For a range of low supply voltages, Vcc the drain to source voltage Vds of $T_{46}$ will increase slightly. Therefore, $T_{46}$ is sized such that variations of Vds of $T_{46}$ and the variation of V1 ($R*I_{bandgap}$) are canceled for a predefined range of supply voltages. In this way, a stable desired V-gate reference voltage is generated that is substantially independent of voltage, process, resistivity and temperature.

Figure 12A:
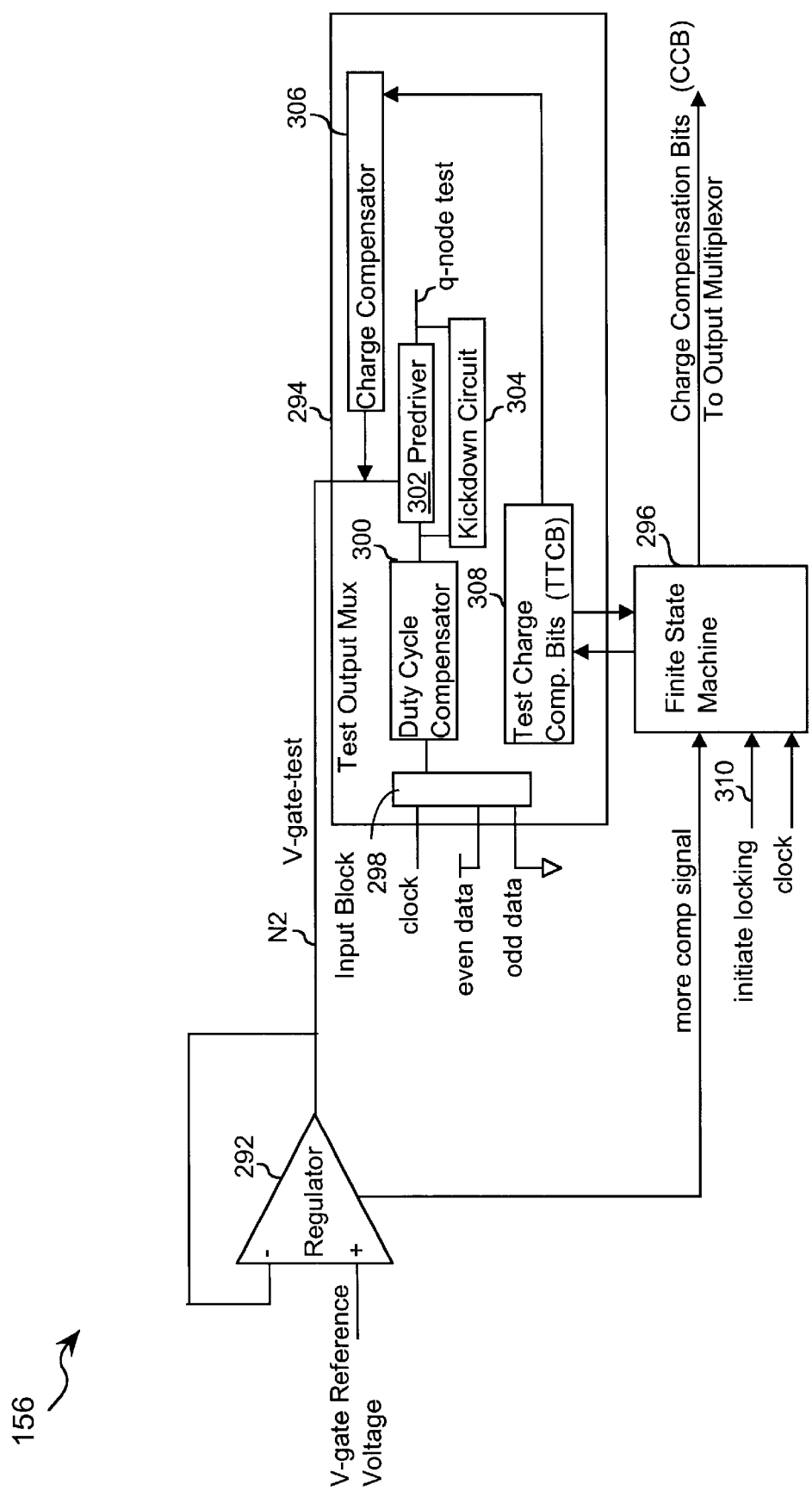
FIG. 12A is a block diagram of the charge compensation bit generator of FIG. 4.
Figure 12B:
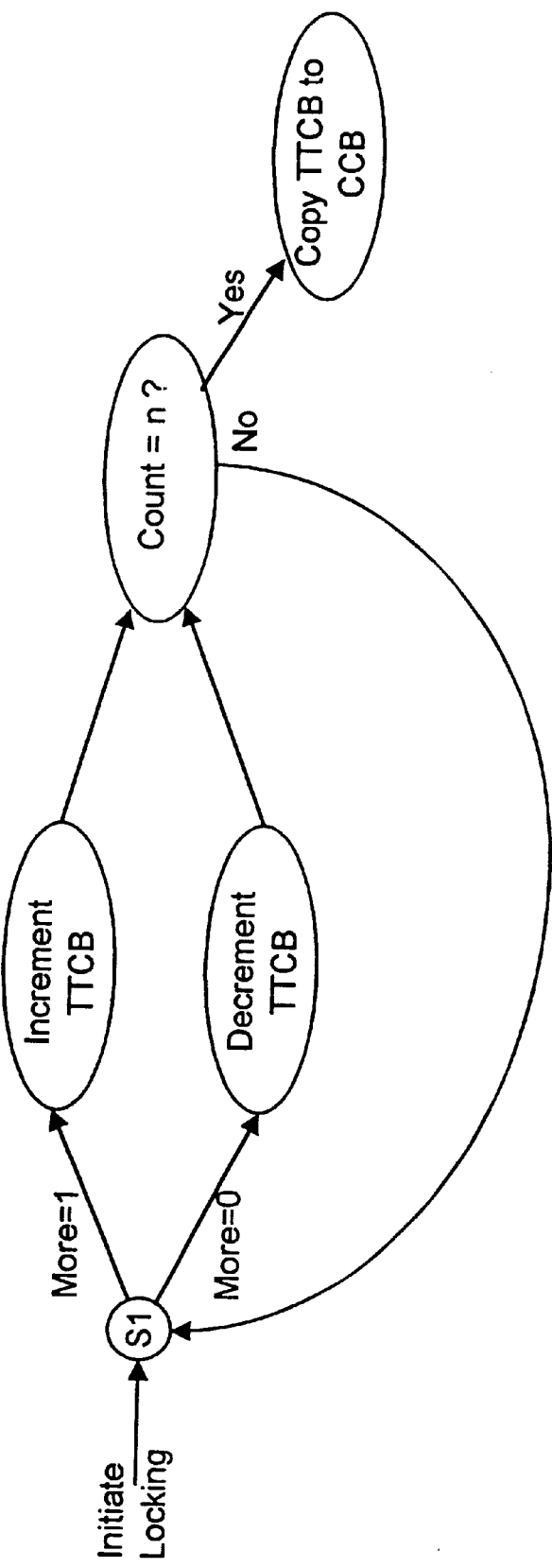
FIG. 12B is a state diagram for a finite state machine in the charge compensation bit generator.

Referring to FIGS. 12A and 12B, the charge compensation bit generator 156 outputs the appropriate charge compensation signals on the charge compensation bits to the charge compensator. The charge compensation bit generator 156 has a regulator 292, a test output multiplexor 294 and a finite state machine (FSM) 296. Alternatively, t he charge compensation bits are driven by registers which can be accessed by other circuitry, or driven by other logic blocks or metal options.

The regulator 292 supplies a voltage called V-gate-test at node N2 to the test output multiplexor 294. The regulator 292 is a scaled down version of the V-gate generator which supplies the output multiplexor with the V-gate voltage.

The test output multiplexor 294 duplicates many of the components of FIG. 4 such as the input block 298, the duty cycle compensator 300, predriver 302, kickdown circuit 304, charge compensator 306 and test charge compensation bits 308. The V-gate-test voltage is supplied to the predriver 302 of the test output multiplexor 294. The even and odd data inputs of the input block 298 of the test output multiplexor 294 are tied to Vcc and ground respectively such that a q-node-test signal output from the predriver 302 toggles at every clock edge to create a continuous current draw from the V-gate-test supply.

The test charge compensation signals on the test charge compensation bits 308 of the FSM 296 are set such that the net amount of current being drawn from the regulator 292 that supplies V-gate-test at node N2 will be equal to zero or as close to zero as possible. However, if the test charge compensation signals are such that there is undercompensation, there will be a net current flow out of the regulator 292. In contrast, if there is overcompensation, there will be a net current flow into the regulator 292.

The regulator 292 adjusts for over or under compensation by providing current to or drawing current from the V-gate-test voltage node N2. The regulator 292 generates a "more comp signal", that indicates whether the regulator 292 is providing or drawing current. The FSM 296 samples the "more comp signal" and updates the test charge compensation bits to cause the charge compensator 306 to change the amount of compensation accordingly.

To determine a desired setting of the charge compensation signals, the FSM 296 iteratively changes the test charge compensation signals on the test charge compensation bits. The test charge compensation bits are changed n times, where n is the number of iterations needed to traverse through all combinations of the charge compensation bits. The change in the test charge compensation signals causes the amount of compensation provided by the charge compensator 306 of the test output multiplexor 294 to change, which in turn causes the regulator 292 to modify the V-gate-test voltage, and modifies the more comp signal. This procedure repeats and at each iteration the regulator 292 provides less modification, until the test charge compensation bits are very close to optimal.

The desired setting of the test charge compensation signals on the test charge compensation bits 308 occurs when consecutive changes to the charge compensation signals on the least significant bits of the test charge compensation bits 308 causes the "more comp signal" to toggle. At this point, the value of the charge compensation bits of the output multiplexor 122 (FIG. 4) are updated with the same values as the test charge compensation signals in the test output multiplexor 294.

An initiate locking signal is input to the FSM 296 on the initiate locking input 310 to start the procedure to determine the desired setting of the charge compensation bits. The initiate locking signal is provided at power on and at intervals as required to compensate for thermal voltage drift.

Figure 13:
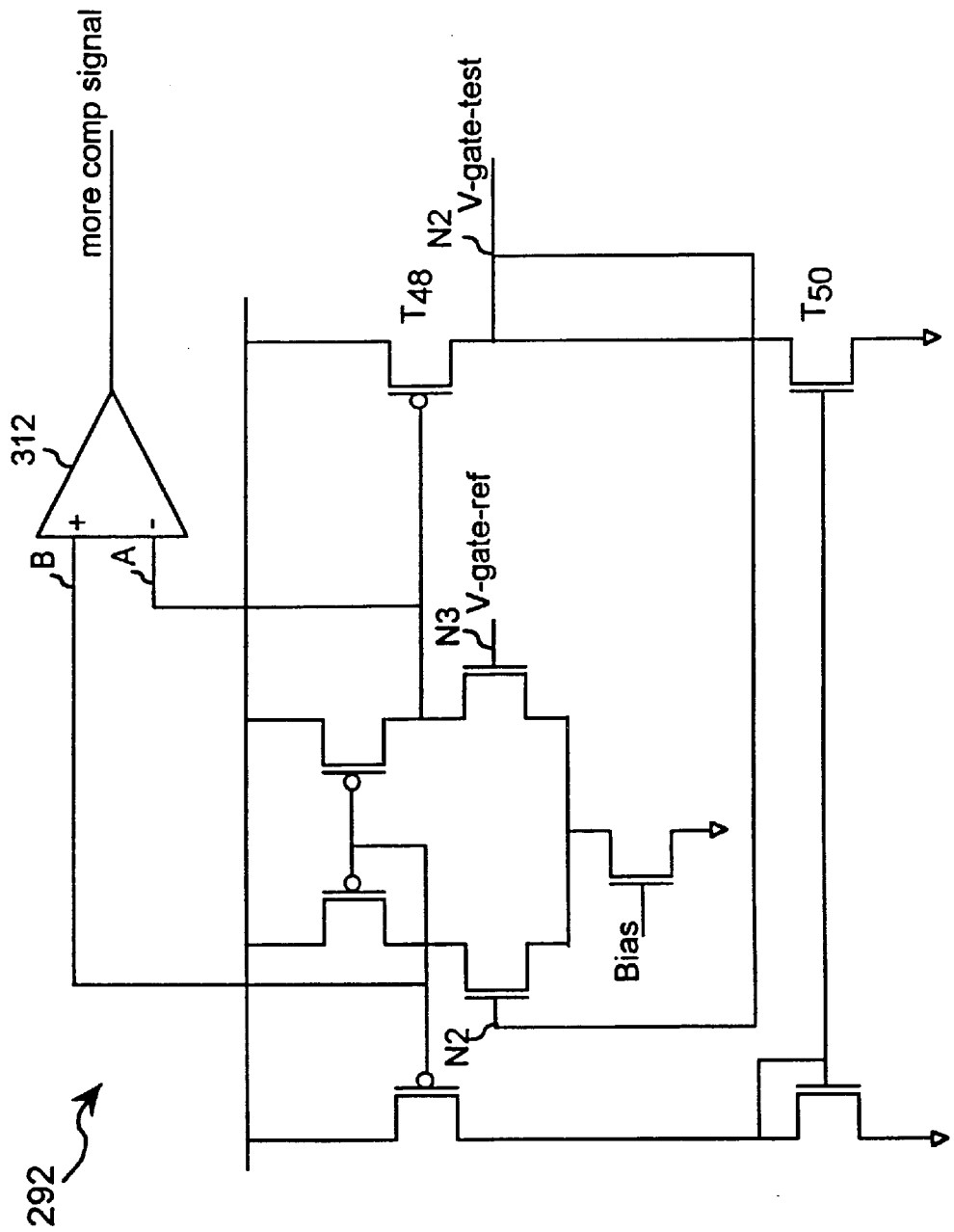
FIG. 13 is a schematic of the regulator of the charge compensation bit generator of FIG. 12A.

FIG. 13 is a schematic of the regulator 292 of the charge compensation bit generator of FIG. 12A. The regulator 292 is a two stage operational amplifier. The operational amplifier attempts to keep the voltage at node N2 equal to the voltage at node N3 which is the output of the V-gate reference block.

The operational amplifier connects to a comparator 312 which generates the "more comp signal." Node A connects to the negative input of the comparator 312 and node B connects to the positive input of the comparator. If the voltage at V-gate-test, node N2, is below that of the V-gate reference voltage, node N3, then the voltage at node A falls below that of node B, thereby turning on $T_{48}$ and providing more current into V-gate-test. If the voltage at V-gate-test, node N2, is above that of the V-gate reference voltage, node N3, then the voltage at node A rises above that of node B, thereby turning off transistor $T_{48}$ and allowing transistor $T_{50}$ to draw current out of V-gate-test at node N2.

When the voltage at node A is less than the voltage at node B, more compensation is needed from the charge compensators of the output multiplexor. When the voltage at node A exceeds the voltage at node B. less compensation is needed from the charge compensators of the output multiplexor. In this way, by comparing the voltages at nodes A and B, the comparator 312 outputs a more compensation signal having a first voltage level when more charge compensation is needed and a second voltage level when less charge compensation is needed.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A charge compensation control circuit, comprising:
   a first node operable to provide a supply voltage for a first circuit having charge consumption characteristics;
   a first charge compensation circuit operably coupled to the first node, wherein the first charge compensation circuit is operable to supply supplemental charge to the first node based on a first charge compensation value; and
   a control circuit operably coupled to the first charge compensation circuit, the control circuit including:
      a second node operable to provide a supply voltage to a second circuit, wherein charge consumption characteristics of the second circuit are substantially similar to charge consumption characteristics of the first circuit;
      a second charge compensation circuit operably coupled to the second node, wherein the second charge compensation circuit is operable to supply supplemental charge to the second node based on a second charge compensation value;
      a regulator operably coupled to the second node, the regulator operative to control a voltage at the second node such that the voltage at the second node corresponds to a reference voltage, wherein the regulator generates a compensation signal when the regulator responds to changes in the voltage on the second node so as to maintain the second node at the voltage corresponding to the reference voltage; and
      a control block operably coupled to the regulator and operable to generate the first and second charge compensation values, wherein the control block adjusts the first and second charge compensation values based on the compensation signal.

2. The charge compensation control circuit of claim 1, wherein the second charge compensation value and the first charge compensation value are equal.

3. The charge compensation control circuit of claim 1, wherein the control block is operable to adjust the second charge compensation value such that modification of the voltage at the second node by the regulator is minimized.

4. The charge compensation control circuit of claim 1, wherein the charge consumption characteristics of the first circuit are dependent on at least one data signal of the first circuit.

5. The charge compensation control circuit of claim 4, wherein the first circuit is a predriver in an output circuit and the at least one data signal includes a data value to be output using the output circuit.

6. The charge compensation control circuit of claim 1, wherein the first charge compensation circuit is operable to supply the supplemental charge to the first node by enabling a charge path for a time period corresponding to a pulse width, wherein the pulse width is based on the first charge compensation value.

7. The charge compensation control circuit of claim 1, wherein the first charge compensation circuit is operable to supply the supplemental charge to the first node by enabling a charge path having a variable flow rate for a time period corresponding to a pulse width, wherein the flow rate of the charge path is based on the first charge compensation value.

8. The charge compensation control circuit of claim 1, wherein the control block includes a finite state machine.

9. The charge compensation control circuit of claim 1, wherein the control block is operable to selectively update the first charge compensation value when the compensation signal toggles.

10. An apparatus for use in conjunction with an output driver, comprising:
    a predriver for generating a first signal based on a clocked data signal;
    a voltage regulator for generating a regulated test voltage on a power supply node of the predriver for use as the high voltage level of the first signal, and for generating a second signal when the voltage regulator adds charge to the power supply node to maintain the voltage on the power supply node;
    a charge compensator for maintaining the test voltage by supplying supplemental charge to the power supply node; and
    a finite state machine for generating a test compensation signal, wherein the charge compensator supplies an amount of supplemental charge to the power supply node based on the test compensation signal, the finite state machine adjusting the test compensation signal in response to the second signal and, upon completion of a predefined test sequence, outputting a compensation signal corresponding to a final value of the test compensation signal.

11. The apparatus or claim 10, further comprising:
    an input block for multiplexing an odd data signal and an even data signal with a clock signal to output a clocked data signal; and
    a duty cycle compensator for receiving the clocked data signal and outputting a precompensated clocked data signal with a duty cycle that is changed by a predetermined amount;
    wherein the predriver is configured to generate the first signal based on the precompensated clocked data signal, the first signal transitioning between a low voltage level and a high voltage level at a predetermined slew rate, such that the first signal has substantially the same duty cycle as the clocked data signal.

* * * * *